(12) United States Patent
Lee et al.

(10) Patent No.: US 11,355,710 B2
(45) Date of Patent: Jun. 7, 2022

(54) LIGHT-EMITTING DIODE AND LIGHT-EMITTING DEVICE INCLUDING THE SAME

(71) Applicant: LG Display Co., Ltd., Seoul (KR)

(72) Inventors: Na-yeon Lee, Paju-si (KR); Seung-Jae Lee, Paju-si (KR); Jong-Kwan Bin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 436 days.

(21) Appl. No.: 16/140,850

(22) Filed: Sep. 25, 2018

(65) Prior Publication Data

US 2019/0097139 A1  Mar. 28, 2019

(30) Foreign Application Priority Data

Sep. 28, 2017 (KR) .................... 10-2017-0126435

(51) Int. Cl.
| | |
|---|---|
| H01L 51/00 | (2006.01) |
| H01L 51/50 | (2006.01) |
| H01L 51/52 | (2006.01) |
| H01L 27/32 | (2006.01) |

(52) U.S. Cl.
CPC ...... *H01L 51/0067* (2013.01); *H01L 27/3244* (2013.01); *H01L 51/0059* (2013.01);
(Continued)

(58) Field of Classification Search
None
See application file for complete search history.

(56) References Cited

U.S. PATENT DOCUMENTS

| | | | |
|---|---|---|---|
| 5,683,832 A | 11/1997 | Bonhote et al. | |
| 2004/0054095 A1* | 3/2004 | Allen | G03G 5/076 |
| | | | 525/418 |

(Continued)

FOREIGN PATENT DOCUMENTS

| | | |
|---|---|---|
| CN | 1132746 A | 10/1996 |
| CN | 102348705 A | 2/2012 |

(Continued)

OTHER PUBLICATIONS

Martin et al., "Imidazoluym ionic liquids in OLEDs: synthesis and improved electroluminescence of an 'ionophilic' diphenylanthracene", Tetrahedron 64 (2008) pp. 6270-6274.

(Continued)

*Primary Examiner* — Jay Yang
(74) *Attorney, Agent, or Firm* — Morgan, Lewis & Bockius LLP

(57) ABSTRACT

The present disclosure relates to a light-emitting diode (LED) in which an organic compound including an imidazolium-based cationic moiety and an amine-based anionic moiety substituted with a strong electron-withdrawing group such as a sulfonyl group or a cyano group is applied to a hole transfer layer, and a light-emitting device. By applying the organic compound according to the present disclosure to the hole transfer layer, an energy barrier between the hole transport layer and an emitting material layer is removed, and an LED having improved hole transport properties can be designed. Therefore, it is possible to realize and manufacture an LED and a light-emitting device, driven at a low voltage and having improved luminous efficiency.

12 Claims, 9 Drawing Sheets

(52) U.S. Cl.
CPC ...... *H01L 51/5004* (2013.01); *H01L 51/5092* (2013.01); *H01L 51/5206* (2013.01); *H01L 51/5221* (2013.01); *H01L 51/0035* (2013.01); *H01L 51/0039* (2013.01); *H01L 51/0043* (2013.01); *H01L 51/502* (2013.01); *H01L 51/506* (2013.01); *H01L 51/5056* (2013.01); *H01L 51/5072* (2013.01); *H01L 51/5096* (2013.01)

(56) References Cited

U.S. PATENT DOCUMENTS

| | | | |
|---|---|---|---|
| 2005/0227155 A1 | 10/2005 | Minami | |
| 2006/0170331 A1* | 8/2006 | Bertram | H05B 33/14 313/498 |
| 2007/0231503 A1* | 10/2007 | Hwang | C09K 11/06 428/1.1 |
| 2011/0315976 A1 | 12/2011 | Suh et al. | |
| 2013/0092906 A1* | 4/2013 | Iwasaki | C08G 61/12 257/40 |
| 2015/0249170 A1 | 9/2015 | Snaith et al. | |
| 2016/0380125 A1 | 12/2016 | Snaith et al. | |

FOREIGN PATENT DOCUMENTS

| | | |
|---|---|---|
| CN | 104769736 A | 7/2015 |
| CN | 106062983 A | 10/2016 |
| JP | 2011-243966 A | 12/2011 |
| KR | 10-2007-0114562 A | 12/2007 |
| KR | 10-2015-0056851 A | 5/2015 |
| WO | WO-2011/132697 A1 * | 10/2011 |

OTHER PUBLICATIONS

First Office Action issued in corresponding Chinese Patent Application No. 201811133889.5, dated May 29, 2020.

* cited by examiner

LIGHT-EMITTING DIODE AND LIGHT-EMITTING DEVICE INCLUDING THE SAME

CROSS-REFERENCE TO RELATED APPLICATIONS

This application claims the benefit under 35 U.S.C. § 119(a) of Korean Patent Application No. 10-2017-0126435 filed in Korea on Sep. 28, 2017, which is incorporated herein by reference in its entirety.

BACKGROUND

Technical Field

The present disclosure relates to a light-emitting diode, and more specifically, to a light-emitting diode having improved luminous efficiency, and a light-emitting device including the same.

Discussion of the Related Art

With the advancement of electronic engineering and information technology, technology of the display field for processing and displaying a massive amount of information has also been rapidly developed. Accordingly, various flat panel display devices replacing the cathode ray tube (CRT) have been developed. Among flat panel display devices, since an organic light-emitting diode (OLED) display device and a quantum dot light-emitting diode (QLED) display device may be formed in a thin structure and have low power consumption, the OLED display device and the QLED display device are used as a next-generation display device which replaces a liquid crystal display (LCD).

An OLED is a device in which, when electric charges are injected into an organic emissive layer formed between an electron injection electrode (cathode) and a hole injection electrode (anode), electrons and holes are paired and then disappear to emit light. Not only may the OLED be formed even on a flexible transparent substrate such as a plastic substrate, but also it is possible to be driven at a low voltage of 10 V or less. Power consumption of the OLED is relatively low, and color purity thereof is high.

FIG. 1 is a schematic diagram illustrating bandgap energies of electrodes constituting a related art OLED and materials constituting a related art emissive layer. Referring to FIG. 1, the OLED includes an anode and a cathode, which face each other, an emitting material layer (EML) disposed between the anode and the cathode, a hole injection layer HIL and a hole transport layer HTL, which are disposed between the anode and the emitting material layer EML, and an electron transport layer ETL disposed between the cathode and the emitting material layer EML.

An OLED is a device in which, when electric charges are injected into an organic emissive layer formed between an electron injection electrode Cathode and a hole injection electrode Anode, electrons and holes are paired and then recombined to emit light. The emitting material layer EML is made of a light-emitting material. Holes injected from the anode and electrons injected from the cathode meet in the emitting material layer EML to form excitons. The light-emitting material included in the emitting material layer EML becomes an excited state due to such energy, and an energy transition of an organic compound from an excited state to a ground state occurs in the emitting material, thereby converting generated energy to emit light.

Meanwhile, the hole transport layer HTL and the hole injection layer HIL transport and inject positive charge carriers, e.g., holes, into the emitting material layer EML from the anode, and the electron transport layer ETL transports and injects negative charge carriers, e.g., electrons, into the emitting material layer EML from the cathode. In order to transport and inject holes and electrons into the emitting material layer EML, each of the layers should be made of a material with appropriate bandgap energy. An emissive layer constituting an OLED has been formed through a deposition process. However, recently, an emissive layer has been formed through a solution process which reduces organic material waste and does not require a color filter.

In an example, the hole injection layer HIL may be made of poly(3,4-ethylenedioxythiophene) polystyrene sulfonate (PEDOT:PSS), and the hole transport layer (HTL) may be made of poly(4-butylphenyl-diphenyl-amine) (poly-TPD). The electron transport layer (ETL) may be made of an oxadiazole-based, triazole-base, benzoxazole-based, benzothiazole-based, benzimidazole-based or triazine-based organic compound, and for example, may be made of 2-biphenyl-4-yl-5-(4-t-butylphenyl)-1,3,4-oxadiazole (PBD).

However, a highest occupied molecular orbital (HOMO) energy level of a light-emitting material constituting the emitting material layer EML is very deep, and a lowest unoccupied molecular orbital (LUMO) energy level thereof is very high. Therefore, the emitting material layer EML functions as an energy barrier when holes are transported from the hole transport layer HTL to the emitting material layer EML and electrons are transported from the electron transport layer ETL to the emitting material layer EML.

However, a difference $\Delta G_H$ between a HOMO energy level of the hole transport layer HTL and a HOMO energy level of the emitting material layer EML is much greater than a difference $\Delta G_L$ between a LUMO energy level of the electron transport layer ETL and a LUMO energy level of the emitting material layer EML. For example, the HOMO energy level of the light-emitting material of the emitting material layer EML may be very low in comparison to a relatively high HOMO energy level of an organic compound constituting the hole transport layer HTL. Therefore, as the transport/injection of holes into the emitting material layer EML is delayed when compared to the transport/injection of electrons into the emitting material layer EML, electric charges may not be injected into the emitting material layer EML in a balanced manner. Such a problem is more serious in a QLED display device having a very deep HOMO energy level.

Electrons excessively injected into the emitting material layer (EML) in comparison to holes are not recombined with the holes so as to form excitons and disappear. In addition, holes and electrons are not recombined in the light-emitting material constituting the emitting material layer EML and are recombined at an interface between the emitting material layer EML and the hole transport layer HTL. Accordingly, luminous efficiency of an OLED is lowered, and a high driving voltage is required to realize desired light emission, resulting in an increase in power consumption.

Meanwhile, in a case in which a thin film is formed through a solution process in order to manufacture an OLED having a multilayered structure, when a lower layer is dissolved in a solvent used for forming an upper layer, materials may be mixed at an interface between the two layers. Thus, types of usable solvents are restricted. Since a material of a hole transport layer HTL dissolved in a restrictively used solvent is also restricted, there is a need to develop a solution process material capable of appropriately controlling an energy gap between an emitting material layer EML and a hole transport layer HTL.

SUMMARY

Accordingly, embodiments of the present disclosure are directed to a light-emitting diode and a light-emitting device including the same that obviate one or more of the problems due to limitations and disadvantages of the related art.

An aspect of the present disclosure is to provide a light-emitting diode in which electric charges may be injected into an emitting material layer in a balanced manner, and a light-emitting device.

Another aspect of the present disclosure is to provide a light-emitting diode having improved luminous efficiency and capable of being driven at a low voltage, and a light-emitting device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a light-emitting diode comprises a first and second electrodes facing each other; and an emissive layer between the first electrode and the second electrode and including a hole transfer layer of an organic material, wherein the hole transfer layer includes an organic compound including an imidazolium-based cationic moiety and an amine-based anionic moiety In an example, the organic compound may be represented by following Formula 1:

Formula 1

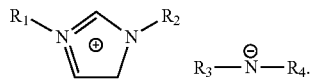

wherein each of $R_1$ and $R_2$ is independently an unsubstituted or substituted $C_1$-$C_{20}$ alkyl group, an unsubstituted or substituted $C_1$-$C_{20}$ alkoxy group, an unsubstituted or substituted $C_5$-$C_{30}$ homoaryl group, or an unsubstituted or substituted $C_4$-$C_{30}$ heteroaryl group, and each of $R_3$ and $R_4$ is independently a cyano group or an unsubstituted or substituted sulfonyl group.

In another example embodiment, the organic compound may be used as a dopant of the hole transfer layer. In this case, a triphenylamine-based organic material may be used as a host of the hole transfer layer.

According to another example embodiment, a light-emitting device, for example, a light-emitting display device may include a substrate; the light-emitting diode on the substrate; and a thin film transistor between the substrate and the light-emitting diode and connected to the light-emitting diode.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Hereinafter, example embodiments the present disclosure will be described with reference to the accompanying drawings in case of need.

Figure 1:
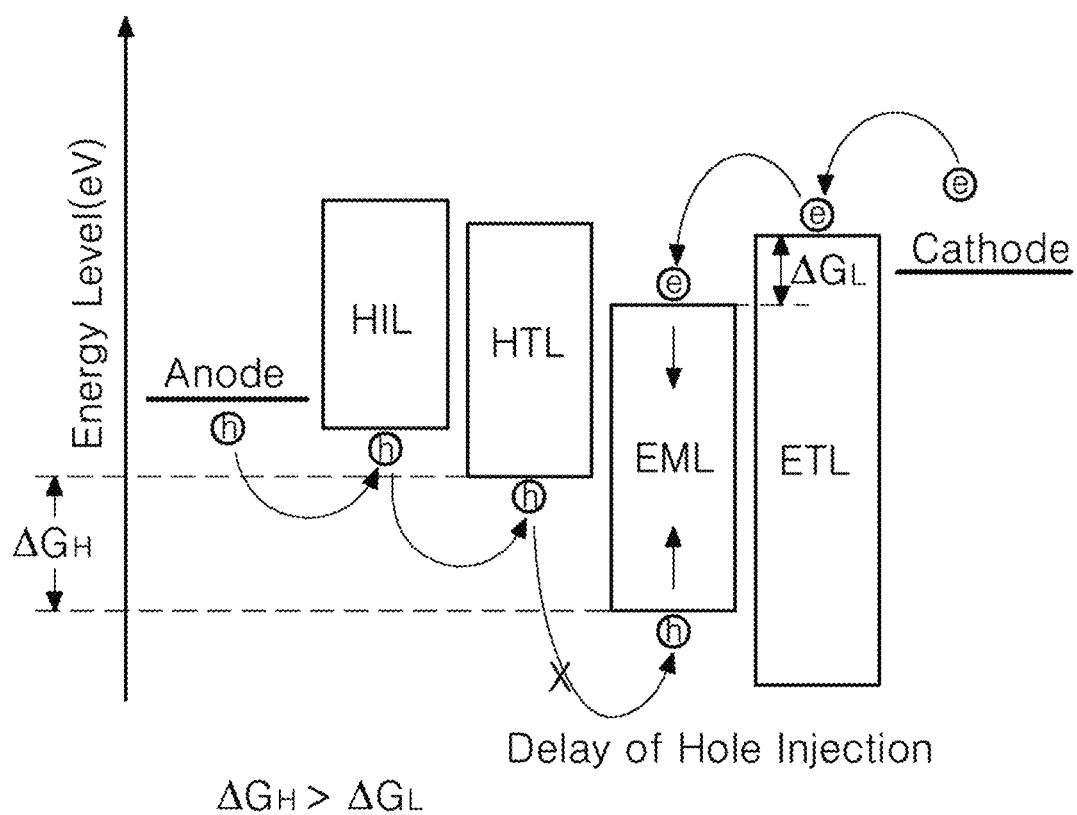
FIG. 1 is a schematic diagram illustrating bandgap energies of electrodes constituting a related art light-emitting diode (LED) and materials constituting an emissive layer disposed between the electrode.
Figure 2:
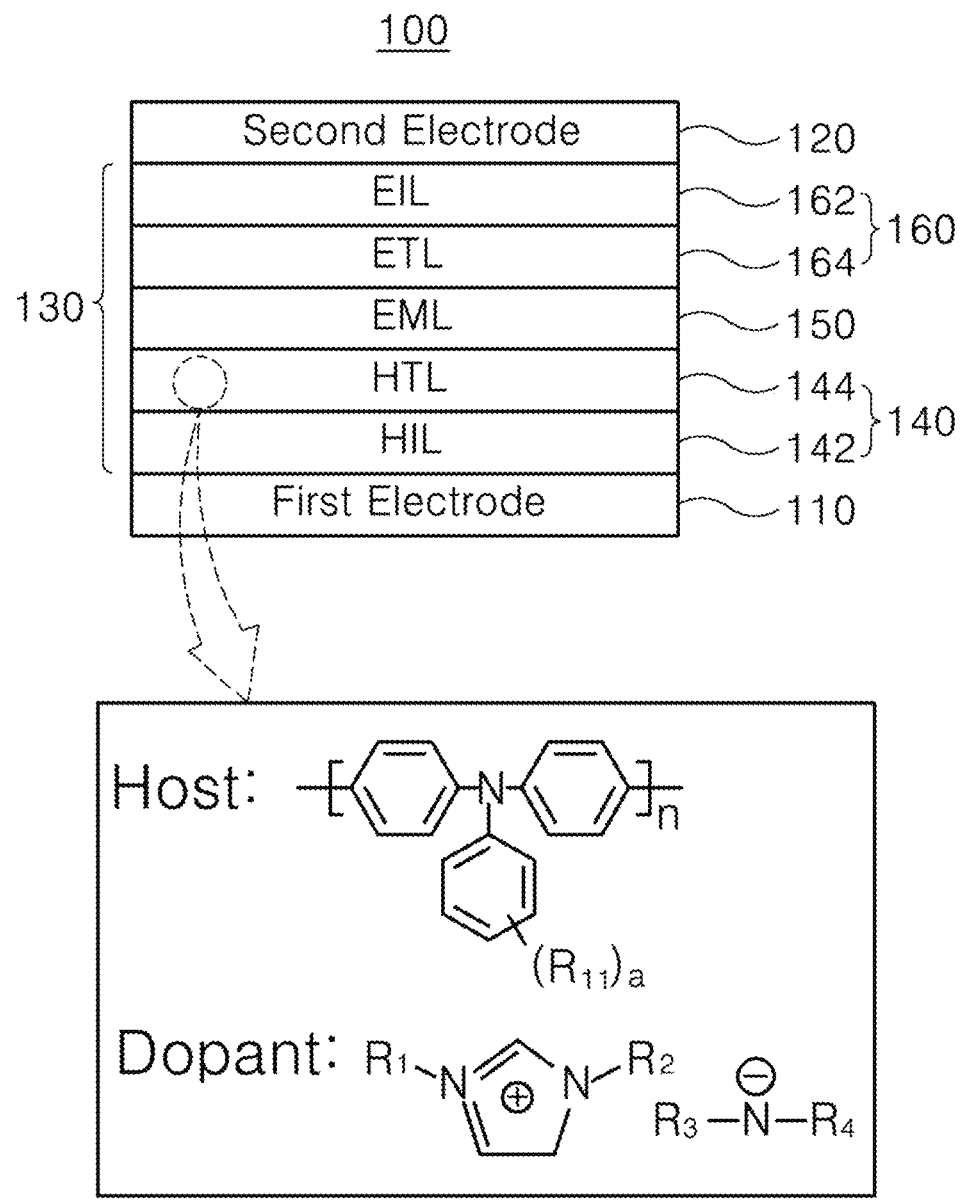
FIG. 2 is a schematic cross-sectional view illustrating an LED having a normal structure according to a first exemplary embodiment of the present disclosure.
Figure 3:
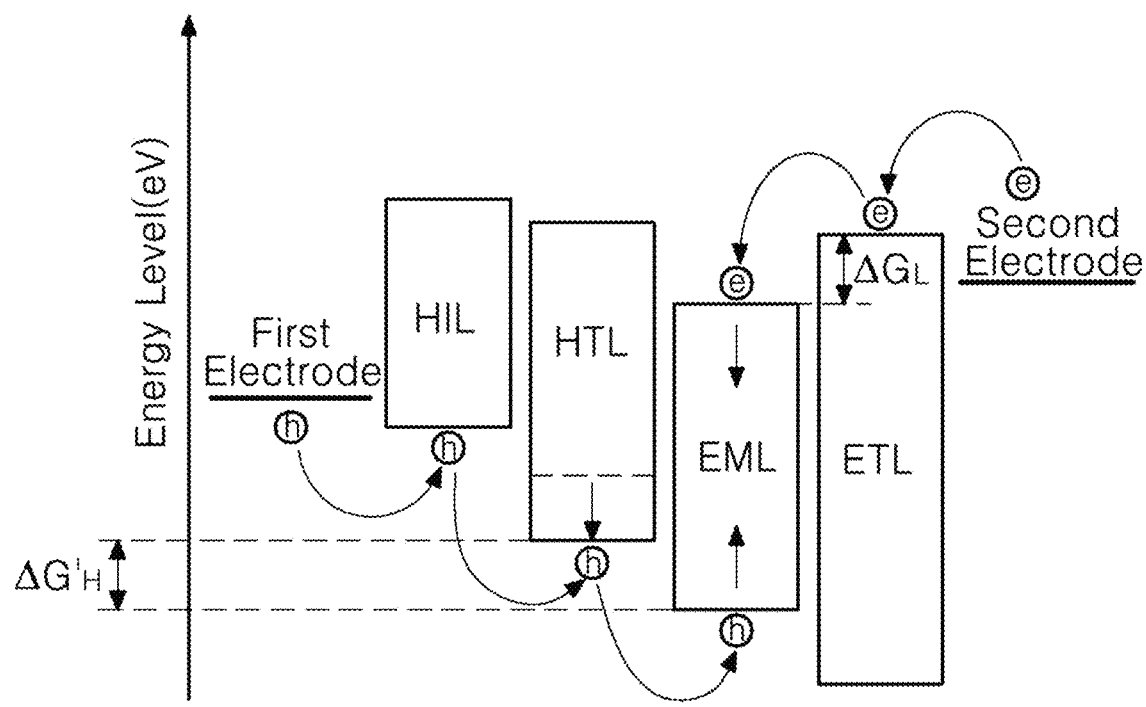
FIG. 3 is a schematic diagram illustrating bandgap energies of electrodes constituting the LED according to the first exemplary embodiment of the present disclosure and materials constituting an emissive layer.

FIG. 2 is a schematic cross-sectional view illustrating a light-emitting diode (LED) 100 having a normal structure according to a first exemplary embodiment of the present disclosure, and FIG. 3 is a schematic diagram illustrating bandgap energies of electrodes constituting the LED 100 according to the first exemplary embodiment of the present disclosure and materials constituting an emissive layer 130.

As shown in FIG. 2, the LED 100 according to the exemplary embodiment of the present disclosure includes a first electrode 110 and a second electrode 120, which face each other, and the emissive layer 130 disposed between the first electrode 110 and the second electrode 120 and including an emitting material layer (EML) 150. In an example, the emissive layer 130 may further include a first charge transfer layer 140 disposed between the first electrode 110 and the EML 150 and a second charge transfer layer 160 disposed between the EML 150 and the second electrode 120.

In the first exemplary embodiment of the present disclosure, the first electrode 110 may be an anode such as a hole injection electrode. The first electrode 110 may be formed on a substrate (not shown in FIG. 2), which may be made of glass or a polymer. In an example, the first electrode 110 may be made of at least one selected from doped or undoped metal oxides including indium tin oxide (ITO), indium zinc oxide (IZO), indium tin zinc oxide (ITZO), indium copper oxide (ICO), tin oxide ($SnO_2$), indium oxide ($In_2O_3$), cadmium:zinc oxide (Cd:ZnO), fluorine:tin oxide (F:$SnO_2$), indium:tin oxide (In:$SnO_2$), gallium:tin oxide (Ga:$SnO_2$), and aluminum:zinc oxide (Al:ZnO (AZO)). Selectively, the first electrode 110 may be made of a metal material such as nickel (Ni), platinum (Pt), gold (Au), silver (Ag), or iridium (Ir), or a nonmetal material such as a carbon nanotube (CNT) in addition to the above-described metal oxides.

In the first exemplary embodiment of the present disclosure, the second electrode 120 may be a cathode such as an electron injection electrode. In an example, the second electrode 120 may be made of at least one selected from Ca, Ba, Ca/Al, LiF/Ca, LiF/Al, $BaF_2$/Al, CsF/Al, $CaCO_3$/Al, $BaF_2$/Ca/Al, Al, Mg, Au:Mg, and Ag:Mg. For example, each of the first electrode 110 and the second electrode 120 may be stacked to have a thickness of about 30 nm to about 300 nm.

In an exemplary embodiment, in the case of a bottom emission-type OLED, the first electrode 110 may be made of a transparent conductive material such as ITO, IZO, ITZO, or AZO, and the second electrode 120 may be made of Ca, Ba, Ca/Al, LiF/Ca, LiF/Al, $BaF_2$/Al, Al, Mg, an Ag:Mg alloy, or the like.

The first charge transfer layer 140 constituting the emissive layer 130 is disposed between the first electrode 110 and the EML 150. In the first exemplary embodiment of the present disclosure, the first charge transfer layer 140 may be a hole transfer layer configured to supply holes to the EML 150. In an example, the first charge transfer layer 140 includes an HIL 142 disposed adjacent to the first electrode 110 between the first electrode 110 and the EML 150 and an HTL 144 disposed adjacent to the EML 150 between the first electrode 110 and the EML 150.

The HIL 142 facilitates the injection of holes into the EML 150 from the first electrode 110. In an example, the HIL 142 may be made of an organic material selected from the group consisting of poly(ethylenedioxythiophene):polystyrenesulfonate (PEDOT:PSS), 4,4',4''-tris(diphenylamino)triphenylamine (TDATA) doped with tetrafluoro-tetracyanoquinodimethane (F4-TCNQ), e.g., p-doped phthalocyanine such as zinc phthalocyanine (ZnPc) doped with F4-TCNQ, N,N'-diphenyl-N,N'-bis(1-naphthyl)-1,1'-biphenyl-4,4''-diamine (α-NPD) doped with F4-TCNQ, hexaazatriphenylene-hexanitrile (HAT-CN), and combinations thereof, but the present disclosure is not limited thereto. In an example, a dopant such as F4-TCNQ may be doped at a ratio of about 1 wt % to about 30 wt % with respect to the weight of a host. The HIL 142 may be omitted according to the structure and shape of the LED 100.

The HTL 144 transports holes from the first electrode 110 to the EML 150. The first charge transfer layer 140 is divided into the HIL 142 and the HTL 144 in the drawings, but the first charge transfer layer 140 may be formed as a single layer. For example, the HIL 142 may be omitted, and the first charge transfer layer 140 may include only the HTL 144.

In an exemplary embodiment, the HTL 144 includes an organic compound which includes an imidazolium-based cationic moiety and an amine-based anionic moiety. An organic compound including a cation moiety and an anion moiety may be represented by Formula 1 below:

Formula 1

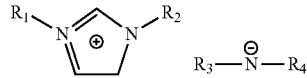

wherein each of $R_1$ and $R_2$ is independently an unsubstituted or substituted $C_1$-$C_{20}$ alkyl group, an unsubstituted or substituted $C_1$-$C_{20}$ alkoxy group, an unsubstituted or substituted $C_5$-$C_{30}$ homoaryl group, or an unsubstituted or substituted $C_4$-$C_{30}$ heteroaryl group, and each of $R_3$ and $R_4$ is independently a cyano group or an unsubstituted or substituted sulfonyl group.

As used herein, the term "unsubstituted" means that a hydrogen atom is bonded, and in this case, the hydrogen atom includes protium, deuterium, or tritium.

A substituent in "substituted" as used herein may include, for example, a $C_1$-$C_{20}$ alkyl group unsubstituted or substituted with a halogen, a $C_1$-$C_{20}$ alkoxy group unsubstituted or substituted with a halogen, a halogen, a cyano group, —$CF_3$, a hydroxyl group, a carboxyl group, a carbonyl group, an amine group, a $C_1$-$C_{10}$ alkyl-substituted amine group, a $C_5$-$C_{30}$ aryl-substituted amine group, a $C_4$-$C_{30}$ heteroaryl-substituted amine group, a nitro group, a hydrazyl group, a sulfonic acid group, a $C_1$-$C_{20}$ alkylsilyl group, a $C_1$-$C_{20}$ alkoxysilyl group, a $C_3$-$C_{30}$ cycloalkylsilyl group, a $C_5$-$C_{30}$ arylsilyl group, a $C_4$-$C_{30}$ heteroarylsilyl group, a $C_5$-$C_{30}$ aryl group, a $C_4$-$C_{30}$ heteroaryl group, and the like, but the present disclosure is not limited thereto. For example, when $R_1$ and/or $R_2$ in Formula 1 is substituted with an alkyl group, the alkyl group may be a linear or branched $C_1$-$C_{20}$ alkyl group, preferably, a linear or branched $C_1$-$C_{10}$ alkyl group.

As used herein, the term "hetero" used in "a heteroaromatic ring," "a heterocycloalkylene group," "a heteroarylene group," "a heteroarylalkylene group," "a heteroaryloxylene group," "a heterocycloalkyl group," "a heteroaryl group," "a heteroarylalkyl group," "a heteroaryloxyl group," "a heteroarylamine group," and the like means that at least one carbon atom (e.g., 1 to 5 carbon atoms) of carbon atoms constituting the aromatic or alicyclic rings are substituted with one heteroatom selected from the group consisting of N, O, S, and combinations thereof.

In an exemplary embodiment, when $R_1$ and/or $R_2$ is an unsubstituted or substituted $C_5$-$C_{30}$ aryl group, $R_1$ and/or $R_2$ may each independently be a non-fused or fused aryl group such as an unsubstituted or substituted phenyl group, biphenyl group, terphenyl group, naphthyl group, anthracenyl group, pentanenyl group, indenyl group, indenoindenyl group, heptalenyl group, biphenylenyl group, indacenyl group, phenalenyl group, phenanthrenyl group, benzophenanthrenyl group, dibenzophenanthrenyl group, azulenyl group, pyrenyl group, fluoranthenyl group, triphenylenyl group, chrysenyl group, tetraphenyl group, tetracenyl group, pleiadenyl group, picenyl group, pentaphenyl group, pentacenyl group, fluorenyl group, indenofluorenyl group, or spiro-fluorenyl group.

In an optional embodiment, when $R_1$ and/or $R_2$ is an unsubstituted or substituted $C_4$-$C_{30}$ heteroaryl group, $R_1$ and/or $R_2$ may each independently be a non-fused or fused heteroaryl group such as an unsubstituted or substituted pyrrolyl group, pyridinyl group, pyrimidinyl group, pyridazinyl group, triazinyl group, tetrazinyl group, imidazolyl group, pyrazolyl group, indolyl group, isoindolyl group, indazolyl group, indolizinyl group, pyrrolizinyl group, carbazolyl group, benzocarbazolyl group, dibenzocarbazolyl group, indolocarbazolyl group, indenocarbazolyl group, benzofurocarbazolyl group, benzothienocarbazolyl group, quinolinyl group, isoquinolinyl group, phthalazinyl group, quinoxalinyl group, cinolinyl group, quinazolinyl group, quinozolinyl group, quinolizinyl group, purinyl group, phthalazinyl group, quinoxalinyl group, benzoquinolinyl group, benzoisoquinolinyl group, benzoquinoxalinyl group, acridinyl group, phenanthrolinyl group, perimidinyl group, phenanthridinyl group, pteridinyl group, cinnolinyl group, naphtharidinyl group, furanyl group, pyranyl group, oxazinyl group, oxazolyl group, oxadiazole group, triazolyl group, dioxinyl group, benzofuranyl group, dibenzofuranyl group, thiopyranyl group, xanthenyl group, chromenyl group, isochromenyl group, thioazinyl group, thiophenyl group, benzothiophenyl group, dibenzothiophenyl group, difluoropyrazinyl group, benzofurodibenzofuranyl group, benzothienobenzothiophenyl group, benzothienodibenzothiophenyl group, benzothienobenzofuranyl group, benzothienodibenzofuranyl group, or N-substituted spiro-pluorenyl group.

In addition, in Formula 1, $R_3$ and/or $R_4$ may each independently be a sulfonyl group or a cyano group, which is not substituted or is substituted with a halogen atom or a $C_1$-$C_{20}$ alkyl halide, preferably, a $C_1$-$C_{10}$ alkyl halide.

The organic compound represented by Formula 1 includes an imidazolium-based cationic moiety, and preferably, an amine-based anionic moiety substituted with a strong electron-withdrawing functional group due to high electronegativity thereof. A cationic moiety and an anionic moiety may interact with each other to lower a highest occupied molecular orbital (HOMO) energy level of the HTL 144 and to induce generation of holes. Therefore, as schematically shown in FIG. 3, a difference $\Delta G'_H$ between the HOMO energy level of the HTL 144 and a HOMO energy level of the EML 150 is greatly decreased, thereby removing an energy barrier between the HTL 144 and the EML 150.

For example, the organic compound represented by Formula 1 may be used in the HTL 144, and thus, the difference $\Delta G'_H$ between the HOMO energy level of the HTL 144 and the HOMO energy level of the EML 150 is the same as or similar to a difference $\Delta G_L$ between a lowest unoccupied molecular orbital (LUMO) energy level of the ETL 164 and a LUMO energy level of the EML 150. Since holes and electrons are injected into the EML 150 in a balanced manner to form excitons, electrons, which disappear without forming excitons, decrease or are eliminated. In addition, luminescence efficiently occurs in a light-emitting material injected into the EML 150 rather than at interfaces of the adjacent charge transfer layers (HTL and ETL) and the EML 150. Therefore, luminous efficiency of the LED 100 can be maximized, and the LED 100 can be driven at a low voltage to reduce power consumption.

In particular, since the organic compound represented by Formula 1 is an ionic material, the HTL 144 including the organic compound represented by Formula 1 may be stacked through a solution process. Accordingly, material waste can be reduced when compared to a deposition process.

In an exemplary embodiment, the amine-based anionic moiety defined in Formula 1 may be substituted with a strong electron-withdrawing functional group. In this case, as hole generating ability is improved, holes generated in the first electrode 110 may be efficiently and rapidly transported and injected into the EML 150. In an example, an anionic moiety may include any one anionic moiety represented by Formula 2 below:

Formula 2

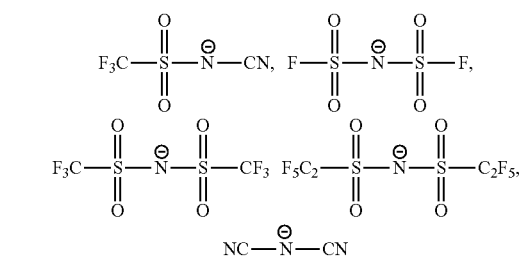

Specifically, the organic compound including the cationic moiety and the anionic moiety represented by Formula 1 may include any one organic compound represented by Formula 3 below:

Formula 3

HT01
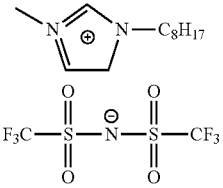

HT02
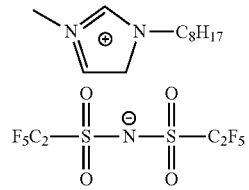

HT03
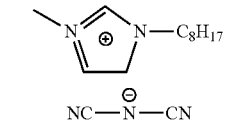

HT04
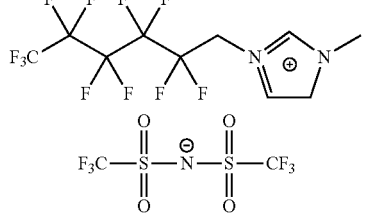

HT05
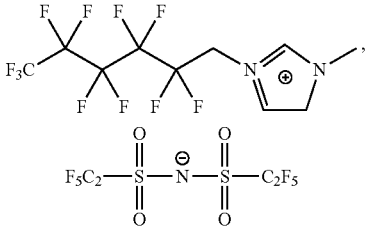

Organic compounds represented by Formula 3 include an imidazolium-based cationic moiety and an amine-based anionic moiety substituted with a strong electron-withdrawing functional group. The organic compounds represented by Formula 3 may be used in the HTL 144, and thus, the HOMO energy level of the HTL 144 may be lowered. Accordingly, a HOMO energy barrier may be removed between the HTL 144 and the EML 150. Since holes and electrons are injected into the EML 150 in a balanced manner, luminous efficiency can be improved, and a driving voltage can be lowered.

In an example, the first charge transfer layer 140 including the HIL 142 and the HTL 144 may be formed using a solution process such as one from among a spin coating method, a drop coating method, a dip coating method, a spray coating method, a roll coating method, a flow coating method, a casting process, a screen printing method, and an inkjet printing method or combinations thereof. For example, each of the HIL 142 and the HTL 144 may have a thickness of about 10 nm to about 200 nm, preferably, a thickness of about 10 nm to about 100 nm, but the present disclosure is not limited thereto.

In an exemplary embodiment, the organic compound represented by Formula 1 or any one of Formula 3 may be used as a dopant of the HTL 144. In this case, a host of the HTL 144 is not particularly limited but may include an organic material having a triamine moiety, to which a solution process is applicable and which has high hole mobility. In an example, the host of the HTL 144 includes any one organic material represented by Formulae 4 to 6:

Formula 4

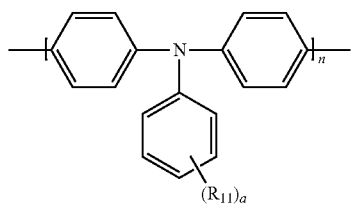

Formula 5

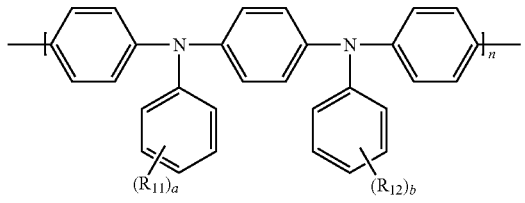

Formula 6

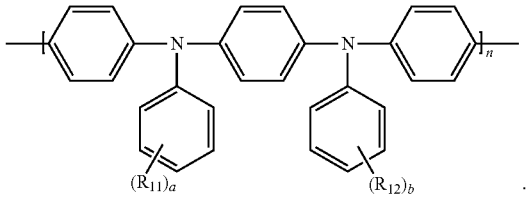

wherein each of $R_{11}$ to $R_{14}$ is independently an unsubstituted or substituted $C_1$-$C_{20}$ linear or branched alkyl group, an unsubstituted or substituted $C_1$-$C_{20}$ alkoxy group, an unsubstituted or substituted $C_5$-$C_{30}$ homoaryl group, or an unsubstituted or substituted $C_4$-$C_{30}$ heteroaryl group; each of a and b is an integer from 1 to 4; and n is an integer of 1 or more.

When the HTL 144 includes a host and a dopant, the organic compound represented by Formula 1 or any one of Formula 3 may be added in a ratio of about 1-200 parts by weight, preferably, about 10-200 parts with respect to 100 parts by weight of the host, but the present disclosure is not limited thereto.

In an exemplary embodiment, $R_{11}$ to $R_{14}$ in Formulae 4 to 6 are each independently an unsubstituted or substituted $C_1$-$C_{20}$ linear or branched alkyl group. In an example, the organic compounds represented by Formulae 4 to 6 include poly[N,N'-bis(4-butylphenyl)-N,N'-bis(phenyl)-benzidine] (poly-TPD or p-TPD), poly[(9,9-dioctylflorenyl-2,7-diyl)-co-(4,4'-(N-(4-sec-butylphenyl)diphenylamine))] (TFB), poly[(9,9-dioctylflorenyl-2,7-diyl)-co-(4,4'-(N-(p-butylphenyl)diphenylamine))], poly[bis(4-phenyl)(2,4,6-trimethylphenyl)amine] (PTAA), N,N'-bis(3-methylphenyl)-N,N'-bis(phenyl)benzidine (TPD), N,N'-bis(4-methylphenyl)-N, N'-bis(phenyl)benzidine), N1,N4-diphenyl-N1,N4-di-m-tolylbenzene-1,4-diamine (TTP), N,N,N',N'-tetra(3-methylphenyl)3,3'-dimethylbenzidine (HMTPD), di-[4-(N, N'-di-p-tolylamino)-phenyl]cyclohexane (TAPC), N4,N4'-bis(4-(6-((3-ethyloxetan-3-yl)methoxy)hexyl)phenyl)-N4, N4'-diphenylbiphenyl-4,4'-diamine (OTPD), 4,4',4"-tris(N, N-phenyl-3-methylphenylamino)triphenylamine, and the like, but the present disclosure is not limited thereto.

In this case, it may be preferable to use a polymer as the host of the HTL 144 and use the organic compound represented by Formula 1 or any one of Formula 3 as the dopant of the HTL 144. In this case, a solution process may be performed to easily form the HTL 144, improve hole mobility of the HTL 144, and lower the HOMO energy level of the HTL 144, thereby lowering or removing a HOMO energy barrier between the HTL 144 and the EML 150.

Meanwhile, the EML 150 may be made of inorganic luminescent particles or an organic light-emitting material. When the EML 150 is made of the inorganic luminescent particles, the inorganic luminescent particles may include inorganic luminescent nanoparticles such as quantum dots (QDs) or quantum rods (QRs).

Quantum dots or quantum rods are inorganic particles in which electrons in an unstable state descend from a conduction band to a valence band to emit light. Since the inorganic luminescent nanoparticles have a very high extinction coefficient and high quantum yield among inorganic particles, the inorganic luminescent nanoparticles generate strong fluorescence. In addition, since an emission wavelength is changed according to a size of the inorganic luminescent nanoparticles, the size of the inorganic luminescent nanoparticles may be adjusted to obtain light in all bands of visible light, thereby realizing various colors. For example, when the inorganic luminescent nanoparticles such as the quantum dots or quantum rods are used as a light-emitting material of the EML 150, it is possible to increase the color purity of each pixel and realize white light composed by red (R) emission, green (G) emission, and blue (B) emission, having high purity.

In an exemplary embodiment, the quantum dots or quantum rods may have a single structure. In another exemplary embodiment, the quantum dots or quantum rods may have a heterostructure of a core/shell. In this case, the shell may be provided as one shell or a multi-shell.

A degree of growth, a crystal structure, and the like of the inorganic luminescent nanoparticles may be adjusted according to reactivity and an injection rate of a reaction precursor constituting the core and/or the shell, and a type and reaction temperature of a ligand. Thus, it is possible to induce emission of light having various wavelength ranges according to an adjustment of an energy bandgap.

In an example, quantum dots or quantum rods may have a heterostructure in which a core component emitting light is located at a center thereof and a shell surrounds a surface of the core to protect the core. A ligand component may surround a surface of the shell so as to disperse quantum dots or quantum rods in a solvent. For example, the quantum dots or quantum rods have a structure in which a component constituting the core and having an energy bandgap is surrounded by the shell having an energy bandgap. The quantum dots or quantum rods may have a type-I core/shell structure which is an illuminant in which electrons and holes move to the core and are recombined in the core to convert energy into light and emit the light.

When the quantum dots or quantum rods constitute the type-I core/shell structure, the core is a portion which substantially emits light, and an emission wavelength of the quantum dots or quantum rods is determined according to a size of the core. In order to obtain a quantum confine effect, the core should have a size smaller than an exciton Bohr radius according to each material and should have an optical band gap at a corresponding size thereof.

Meanwhile, the shell constituting the quantum dots or quantum rods promotes the quantum confine effect of the core and determines stability of the quantum dots or quantum rods. Unlike internal atoms, atoms appearing on a surface of colloidal quantum dots or quantum rods having a single structure have lone pair electrons which do not participate in a chemical bond. Since an energy level of the surface atoms is placed between a conduction band edge and a valence band edge of the quantum dots or quantum rods, electric charges may be trapped to form surface defects. Due to a non-radiative recombination process of excitons, caused by the surface defects, luminous efficiency of the quantum dots or quantum rods can be reduced. In addition, the trapped electric charges react with external oxygen and compounds to cause a chemical composition variation of the quantum dots or quantum rods, or the quantum dots or quantum rods can permanently lose electrical/optical properties thereof.

Thus, in an exemplary embodiment, the quantum dots or quantum rods may have a heterostructure of a core/shell. In order for the shell to be efficiently formed on a surface of the core, a lattice constant of a material constituting the shell should be similar to a lattice constant of a material constituting the core. Since the surface of the core is surrounded by the shell, oxidation of the core can be prevented to improve chemical stability of the quantum dots or quantum rods, loss of excitons caused by surface trapping on the surface of the core can be minimized, and energy loss due to molecular vibration can be prevented, thereby improving quantum efficiency.

Quantum dots or quantum rods may be semiconductor nanocrystal or metal oxide particles having a quantum confine effect. For example, the quantum dots or quantum rods may include a group II-VI, group III-V, group IV-VI, or group I-III-VI compound semiconductor nanocrystals. More specifically, a core and/or a shell constituting the quantum dots or quantum rods may be II-VI group compound semiconductor nanocrystals such as CdS, CdSe, CdTe, ZnS, ZnSe, ZnTe, HgS, HgTe and/or combinations thereof; group III-V compound semiconductor nanocrystals such as GaP, GaAs, GaSb, InP, InAs, InSb, and/or combinations thereof; group IV-VI compound semiconductor nanocrystals such as PbS, PbSe, PbTe, and/or combinations thereof; group I-III-VI compound semiconductor nanocrystals such as $AgGaS_2$, $AgGaSe_2$, $AgGaTe_2$, $CuInS_2$, $CuInSe_2$, $CuGaS_2$, $CuGaSe_2$ and/or combinations thereof; metal oxide nanoparticles such as ZnO, $TiO_2$, and/or a combination thereof; and/or core-shell structured nanocrystals such as CdSe/ZnSe, CdSe/ZnS, CdS/ZnSe, CdS/ZnS, ZnSe/ZnS, InP/ZnS, ZnO/MgO, and/or any combination thereof. Semiconductor nanoparticles may be undoped or doped with a rare earth element such as Eu, Er, Tb, Tm, Dy, or any combination thereof, or may be doped with a transition metal element such as Mn, Cu, Ag, or any combination thereof.

For example, the core constituting the quantum dot or the quantum rod may be selected from the group consisting of ZnSe, ZnTe, CdSe, CdTe, InP, ZnCdS, $Cu_xIn_{1-x}S$, $Cu_xIn_{1-x}Se$, $Ag_xIn_{1-x}S$, and combinations thereof. In addition, the shell constituting the quantum dot or quantum rod may be selected from the group consisting of ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, $Cd_xZn_{1-x}S$, and combinations thereof.

Meanwhile, the quantum dots may be alloy quantum dots (QDs) (e.g., $CdS_xSe_{1-x}$, $CdSe_xTe_{1-x}$, or $Zn_xCd_{1-x}Se$), such as homogeneous alloy quantum dots or gradient alloy quantum dots.

When the EML 150 is made of inorganic luminescent particles such as quantum dots or quantum rods, the EML 150 is formed by applying a solution containing quantum dots or quantum rods in a solvent on the first charge transfer layer 140, for example, the HTL 144, through a process using the solution, and then, volatilizing the solvent.

In an exemplary embodiment, the EML 150 may be formed by applying a dispersion containing luminescent particles such as quantum dots or quantum rods in a solvent on the first charge transfer layer 140 through a solution process, and then, volatilizing the solvent. The EML 150 may be stacked by using a solution process such as one from among a spin coating method, a drop coating method, a dip coating method, a spray coating method, a roll coating method, a flow coating method, a casting process, a screen printing method, and inkjet printing method or combinations thereof.

In an exemplary embodiment, a white LED may be manufactured by including organic luminescent nanoparticles such as quantum dots or quantum rods, having about 440 nm, about 530 nm, or about 620 nm PL emission properties in the EML 150. Selectively, the EML 150 may include luminescent nanoparticles such as quantum dots or quantum rods, having any one color of a red color, a green color, and a blue color, and may be implemented to individually emit any one of red light, green light, and blue light.

In another alternative embodiment, the EML 150 may be made of an organic light-emitting material. When the EML 150 is made of the organic light-emitting material, the organic light-emitting material is not particularly limited as long as it is a commonly used organic light-emitting material. For example, the EML 150 may include an organic light-emitting material emitting red light, green light, and/or blue light and may include a fluorescent material or a phosphorescent material. In addition, the organic light-emitting material constituting the EML 150 may include a host and a dopant. When the organic light-emitting material is configured as a host-dopant system, a dopant may be doped at a ratio of about 1-50 wt %, preferably, about 1-30 wt % with respect to the weight of a host, but the present disclosure is not limited thereto.

An organic host used in the EML 150 is not particularly limited as long as it is a commonly used material. In an example, the organic host used in the EML 150 may include at least one selected from tris(8-hydroxyquinoline)aluminum (Alq3), TCTA, PVK, 4,4'-bis(N-carbazolyl)-1,1'-biphenyl (CBP), 4,4'-bis(9-carbazolyl)-2,2'-dimethylbiphenyl (CDBP), 9,10-di(naphthalene-2-yl)anthracene (ADN), 3-tert-butyl-9,10-di(naphtha-2-yl)anthracene (TBADN), 2-methyl-9,10-bis(naphthalene-2-yl)anthracene (MADN), 1,3,5-tris(N-phenylbenzimidazole-2-yl)benzene (TPBi), distyrylarylene (DSA), mCP, 1,3,5-tris(carbazol-9-yl)benzene (TCP), and the like.

When the EML 150 emits red light, a dopant included in the EML 150 may include an organic compound or an organic metal complex such as 5,6,11,12-tetraphenylnaphthalene (rubrene), bis(2-benzo[b]-thiophene-2-yl-pyridine)(acetylacetonate)iridium (III) (Ir(btp)$_2$(acac)), bis[1-(9,9-diemthyl-9H-fluoren-2-yl)-isoquinoline](acetylacetonate)iridium (III) (Ir(fliq)$_2$(acac)), bis[2-(9,9-diemthyl-9H-fluoren-2-yl)-quinoline](acetylacetonate)iridium (III) (Ir(flq)$_2$(acac)), bis-(2-phenylquinoline)(2-(3-methylphenyl)pyridinate)iridium (III) (Ir(phq)$_2$typ), or iridium(III)bis(2-(2,4-difluorophenyl)quinoline)picolinate (FPQIrpic), but the present disclosure is not limited thereto.

When the EML 150 emits green light, a dopant included in the EML 150 may include an organic compound or an organic metal complex such as N,N'-dimethyl-quinacridone (DMQA), 9,10-bis[N,N-di-(p-tolyl)amino] anthracene (TTPA), 9,10-bis[phenyl(m-tolyl)-amino]anthracene (TPA), bis(2-phenylpyridine)(acetylacetonate)iridium (III) (Ir(ppy)$_2$(acac)), fac-tris(phenylpyridine)iridium (III) (fac-Ir(ppy)$_3$), or tris[2-(p-tolyl)pyridine]iridium (III) (Ir(mppy)$_3$), but the present disclosure is not limited thereto.

When the EML 150 emits blue light, a dopant included in the EML 150 may include an organic compound or an organic metal complex such as 4,4'-bis[4-(di-p-tolylamino)styryl]biphenyl (DPAVBi), perylene, 2,5,8,11-tetra-tert-butylpherylene (TBPe), bis[3,5-difluoro-2-(2-pyridyl)phenyl-(2-carboxypyridyl)]iridium (III) (FirPic), mer-tris(1-phenyl-3-methylimidazolin-2-ylidene-C,C(2)'iridium (III) (mer-Ir(pmi)$_3$), or tris(2-(4,6-difluorophenyl)pyridine)iridium (III) (Ir(Fppy)$_3$), but the present disclosure is not limited thereto.

When the EML 150 is made of an organic light-emitting material, the EML 150 may be formed using a vacuum deposition process including a vacuum vapor deposition process and a sputtering process, or a solution process such as one from among a spin coating method, a drop coating method, a dip coating method, a spray coating method, a roll coating method, a flow coating method, a casting process, a screen printing method, and inkjet printing method or combinations thereof.

Meanwhile, the second charge transfer layer 160 is disposed between the EML 150 and the second electrode 120. In the present embodiment, the second charge transfer layer 160 may be an electron transfer layer configured to supply electrons to the EML 150. In an exemplary embodiment, the second charge transfer layer 160 includes an electron injection layer (EIL) 162 disposed adjacent to the second electrode 120 between the second electrode 120 and the EML 150 and an electron transport layer (ETL) 164 disposed adjacent to the EML 150 between the second electrode 120 and the EML 150.

The EIL 162 facilitates the injection of electrons into the EML 150 from the second electrode 120. For example, the EIL 162 may be made of a material in which fluorine is doped into or bonded to a metal such as Al, Cd, Cs, Cu, Ga, Ge, In, or Li, or may be made of a metal oxide such as titanium dioxide (TiO$_2$), zinc oxide (ZnO), zirconium oxide (ZrO), tin oxide (SnO$_2$), tungsten oxide (WO$_3$), or tantalum oxide (Ta$_2$O$_3$), which is doped or not doped with Al, Mg, In, Li, Ga, Cd, Cs, Cu, or the like.

The ETL 164 transports electrons to the EML 150. The ETL 164 may be made of inorganic and/or organic materials. When the ETL 164 is made of the inorganic material, the ETL 164 may be made of an inorganic material selected from the group consisting of metal or non-metal oxides such as titanium dioxide (TiO$_2$), zinc oxide (ZnO), zinc magnesium oxide (ZnMgO), zirconium oxide (ZrO), tin oxide (SnO$_2$), tungsten oxide (WO$_3$), tantalum oxide (Ta$_2$O$_3$), hafnium oxide (HfO$_3$), aluminum oxide (Al$_2$O$_3$), zirconium silicon oxide (ZrSiO$_4$), barium titanium oxide (BaTiO$_3$), or barium zirconium oxide (BaZrO$_3$), which is doped or not doped with Al, Mg, In, Li, Ga, Cd, Cs, Cu, or the like; semiconductor particles such as CdS, ZnSe, or ZnS, which are doped or not doped with Al, Mg, In, Li, Ga, Cd, Cs, Cu, or the like; a nitride such as Si$_3$N$_4$; and combinations thereof.

When the ETL 164 is made of the organic material, the ETL 164 may be made of an organic material selected from an oxazole-based compound, an isoxazole-based compound, a triazole-based compound, an isothiazole-based compound, an oxadiazole-based compound, a thiadiazole-based compound, a phenanthroline-based compound, a perylene-based compound, a benzoxazole-based compound, a benzothiazole-based compound, a benzimidazole-based compound, a triazine-based compound, and an aluminum complex. Specifically, the organic material constituting the ETL 164 may be selected from materials including, but are not limited to, 3-(biphenyl-4-yl)-5-(4-tert-butylphenyl)-4-phenyl-4H-1,2,4-triazole (TAZ), bathocuproine (2,9-dimethyl-4,7-diphenyl-1,10-phenanthroline) (BCP), 2,2',2"-(1,3,5-benzinetriyl)-tris(1-phenyl-1-H-benzimidazole) (TPBi), 2-[4-(9,10-di-2-naphthalenyl-2-anthracenyl)phenyl]-1-phenyl-1H-benzimidazole, tris(8-hydroxyquinoline)aluminum (Alq3), bis(2-methyl-8-quinolinato)-4-phenylphenolate aluminum (III) (Balq), 8-hydroxy-quinolinato lithium (Liq), bis(2-methyl-quinolinato)(triphenylsiloxy) aluminum (III) (Salq), and combinations thereof.

Similar to the first charge transfer layer 140, the second charge transfer layer 160 is illustrated in FIG. 2 as including two layers such as the EIL 162 and the ETL 164. However, the second charge transfer layer 160 may include only a single layer such as the ETL 164. In addition, the second charge transfer layer 160 may be formed to include a single layer such as the ETL 164 in which cesium carbonate is blended with an electron transport material including the above-described inorganic material.

The second charge transfer layer 160 including the EIL 162 and/or the ETL 164 may be formed using a solution process such as one from among a spin coating method, a drop coating method, a dip coating method, a spray coating method, a roll coating method, a flow coating method, a casting process, a screen printing method, and inkjet printing method or combinations thereof. In an example, each of the EIL 162 and/or the ETL 164 may be stacked to have a thickness of about 10 nm to about 200 nm, preferably, a thickness of about 10 nm to about 100 nm.

For example, when the HTL 144 constituting the first charge transfer layer 140 is made of an organic material and the second charge transfer layer 160 includes a hybrid charge transport layer (CTL) made of an inorganic material, emission properties of the LED 100 can be improved.

Meanwhile, when holes pass through the EML 150 and move to the second electrode 120 or electrons pass through the EML 150 and move to the first electrode 110, a lifespan and efficiency of a device can be reduced. In order to prevent this, the LED 100 according to the first exemplary embodiment of the present disclosure may include at least one exciton blocking layer disposed adjacent to the EML 150.

For example, the LED 100 according to the first exemplary embodiment of the present disclosure may include an electron blocking layer (EBL) configured to control and prevent movement of electrons between the HTL 144 and the EML 150.

In an example, the electron blocking layer may be made of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, tri-p-tolylamine, 1,1-bis[4-[N,N-di(p-tolyl)amino]phenyl]cyclohexane (TAPC), m-MTDATA, 1,3-bis(N-carbazolyl) benzene (mCP), 3,3'-bis (N-carbazolyl)-1,1'-biphenyl (mCBP), Poly-TPD, copper phthalocyanine (CuPc), DNTPD, 1,3,5-tris[4-(diphenylamino)phenyl]benzene (TDAPB), and/or the like.

In addition, a hole blocking layer HBL may be disposed as a second exciton blocking layer between the EML 150 and the ETL 164, thereby preventing movement of holes between the EML 150 and the ETL 164. In an exemplary embodiment, a material of the hole blocking layer may include a derivative of oxadiazole, triazole, phenanthroline, benzoxazole, benzothiazole, benzimidazole, or triazine usable in the ETL 164.

For example, the hole blocking layer may be made of at least one selected from 2,9-dimethyl-4,7-diphenyl-1,10-phenanthroline (BCP), BAlq, Alq3, PBD, spiro-PBD, and/or Liq, which have a HOMO energy level deeper than that of a material used in the EML 150.

As described above, according to the first exemplary embodiment of the present disclosure, the HTL 144 constituting the first charge transfer layer 140 disposed between the first electrode 110 and the EML 150 includes the organic compound which includes the imidazolium-based cationic moiety and the amine-based anionic moiety. The HOMO energy level of the HTL 144 is lowered to reduce the HOMO energy barrier between the HTL 144 and the EML 150. Since holes and electrons are injected into the EML 150 in a balanced manner, luminous efficiency of the LED 100 can be improved, and the LED 100 can be driven at a low voltage to reduce power consumption. In addition, since a solution process is possible, material waste can be reduced.

An LED having the normal structure has been described with reference to FIGS. 2 and 3, the normal structure indicating a structure in which a hole transfer layer is disposed between a first electrode having a relatively low work function value and an EML and an electron transfer layer is disposed between a second electrode having a relatively high work function value and the EML. An LED may have an inverted structure rather than a normal structure, and this will be described.

Figure 4:
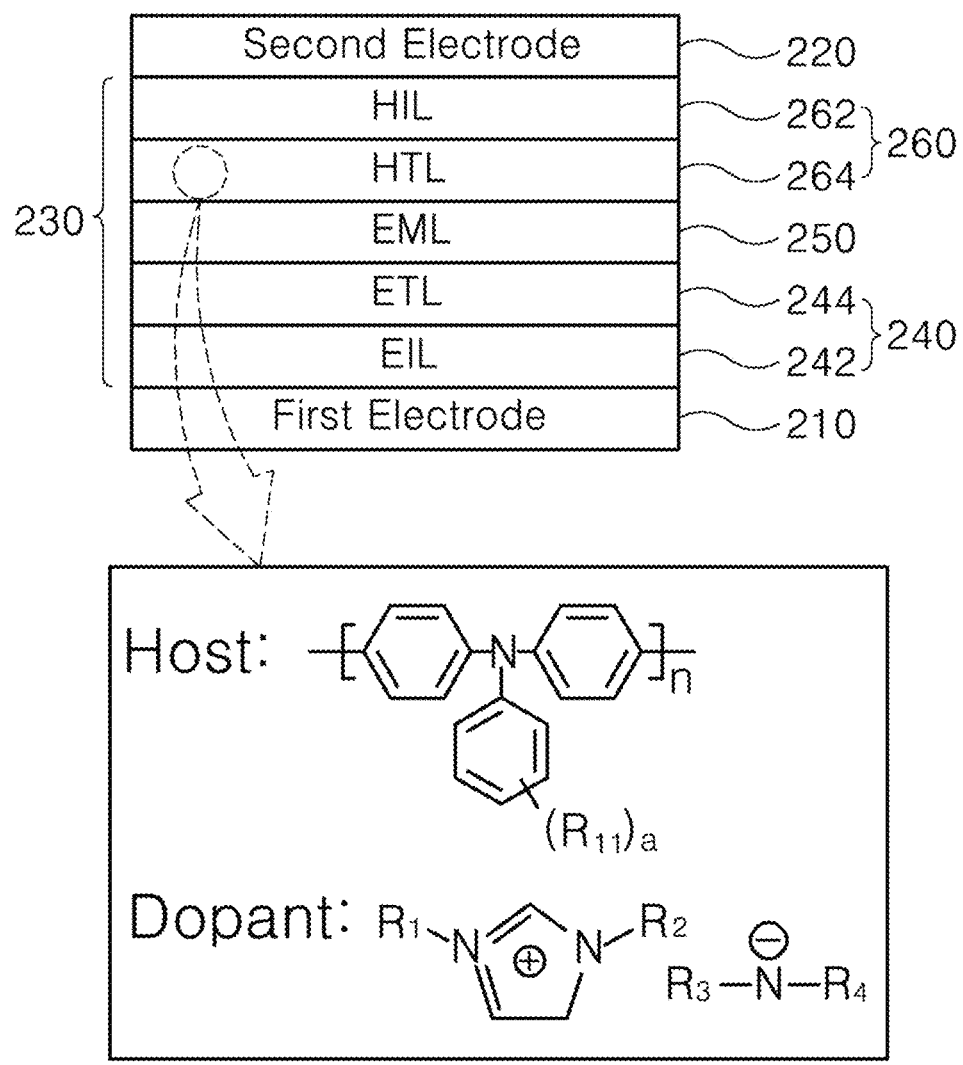
FIG. 4 is a schematic cross-sectional view illustrating an LED having an inverted structure according to a second exemplary embodiment of the present disclosure.
Figure 5:
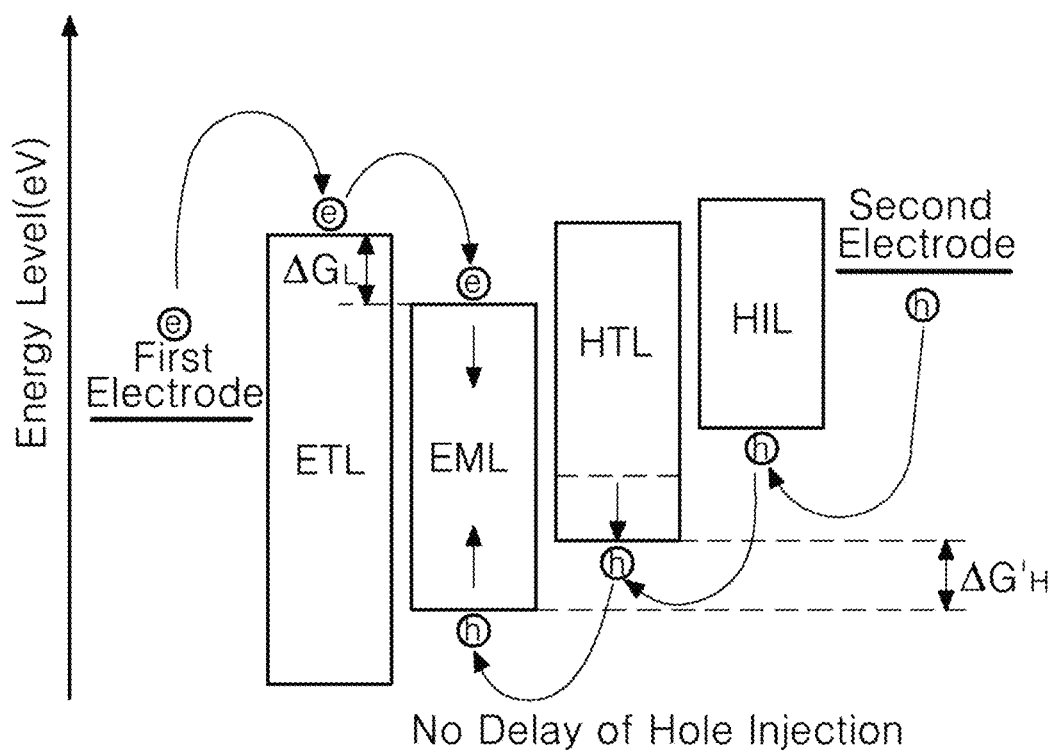
FIG. 5 is a schematic diagram illustrating bandgap energies of electrodes constituting the LED according to the second exemplary embodiment of the present disclosure and materials constituting an emissive layer.

FIG. 4 is a schematic cross-sectional view illustrating an LED 200 having an inverted structure according to a second exemplary embodiment of the present disclosure, and FIG. 5 is a schematic diagram illustrating bandgap energies of electrodes constituting the LED 200 according to the second exemplary embodiment of the present disclosure and materials constituting an emissive layer 230.

As shown FIG. 4, the LED 200 according to the second exemplary embodiment of the present disclosure includes a first electrode 210, a second electrode 220 facing the first electrode 210, and the emissive layer 230 including an EML 250 disposed between the first electrode 210 and the second electrode 220. The emissive layer 230 may further include a first charge transfer layer 240 disposed between the first electrode 210 and the EML 250 and a second charge transfer layer 260 disposed between the second electrode 220 and the EML 250.

In the second exemplary embodiment of the present disclosure, the first electrode 210 may be a cathode such as an electron injection electrode. In an example, the first electrode 210 may be made of a doped or undoped metal oxide such as ITO, IZO, ITZO, ICO, $SnO_2$, $In_2O_3$, Cd:ZnO, F:$SnO_2$, In:$SnO_2$, Ga:$SnO_2$, or AZO, or may be made of a material including nickel (Ni), platinum (Pt), gold (Au), silver (Ag), iridium (Ir), or a carbon nanotube in addition to the above-described metal oxides.

In the second exemplary embodiment of the present disclosure, the second electrode 220 may be an anode such as a hole injection electrode. In an example, the second electrode 220 may be made of at least one selected from Ca, Ba, Ca/Al, LiF/Ca, LiF/Al, $BaF_2$/Al, CsF/Al, $CaCO_3$/Al, $BaF_2$/Ca/Al, Al, Mg, Au:Mg, and Ag:Mg. For example, each of the first electrode 210 and the second electrode 220 may be stacked to have a thickness of 30 nm to 300 nm.

In the second exemplary embodiment of the present disclosure, the first charge transfer layer 240 may be an electron transfer layer configured to supply electrons to the EML 250. In an exemplary embodiment, the first charge transfer layer 240 includes an EIL 242 disposed adjacent to the first electrode 210 between the first electrode 210 and the EML 250 and an ETL 244 disposed adjacent to the EML 250 between the first electrode 210 and the EML 250.

The EIL 242 may be made of a material in which fluorine is doped into or bonded to a metal such as Al, Cd, Cs, Cu, Ga, Ge, In, or Li, or may be made of a metal oxide such as $TiO_2$, ZnO, ZrO, $SnO_2$, $WO_3$, or $Ta_2O_3$, which is doped or not doped with Al, Mg, In, Li, Ga, Cd, Cs, Cu, or the like.

The ETL 244 may be made of inorganic and/or organic materials. When the ETL 244 is made of the inorganic material, the ETL 244 may be made of an inorganic material selected from the group consisting of metal or non-metal oxides such as $TiO_2$, ZnO, ZnMgO, ZrO, $SnO_2$, $WO_3$, $Ta_2O_3$, $HfO_3$, $Al_2O_3$, $ZrSiO_4$, $BaTiO_3$, or $BaZrO_3$, which is doped or not doped with Al, Mg, In, Li, Ga, Cd, Cs, Cu, or the like; semiconductor particles such as CdS, ZnSe, or ZnS, which are doped or not doped with Al, Mg, In, Li, Ga, Cd, Cs, Cu, or the like; a nitride such as $Si_3N_4$; and combinations thereof.

When the ETL 244 is made of the organic material, the ETL 244 may be made of at least one selected from an oxazole-based compound, an isoxazole-based compound, a triazole-based compound, an isothiazole-based compound, an oxadiazole-based compound, a thiadiazole-based compound, a perylene-based compound, and an aluminum complex. Specifically, the organic material constituting the ETL 244 may include an organic material selected from the group consisting of TAZ, BCP, TPBi, 2-[4-(9,10-di-2-naphthalenyl-2-anthracenyl)phenyl]-1-phenyl-1H-benzimidazole, Alq3, Balq, Liq, Salq, and combinations thereof, but the present disclosure is not limited thereto.

Meanwhile, the first charge transfer layer 240 may include only a single layer of the ETL 244. In addition, the first charge transfer layer 240 may be formed to include a single layer of the ETL 244 in which cesium carbonate is blended with an electron transport material including the above-described inorganic material. In an example, each of the EL 242 and the ETL 244 may be stacked to have a thickness of about 10 nm to about 200 nm, preferably, a thickness of about 10 nm to about 100 nm.

The EML 250 may be made of inorganic luminescent particles or an organic light-emitting material. The inorganic luminescent particles may be inorganic luminescent nanoparticles such as quantum dots or quantum rods. Quantum dots or quantum rods may have a single structure or a heterostructure of a core/shell.

Quantum dots or quantum rods may be semiconductor nanocrystals or metal oxide particles having a quantum confine effect. For example, the quantum dots or quantum rods may include a group II-VI, group III-V, group IV-VI, or group I-III-VI nano semiconductor compound. More specifically, the core and/or shell constituting quantum dots or quantum rods may be II-VI group compound semiconductor nanocrystals such as CdS, CdSe, CdTe, ZnS, ZnSe, ZnTe, HgS, HgTe and/or combinations thereof, group III-V or group IV compound semiconductor nanocrystals such as GaP, GaAs, GaSb, InP, InAs, InSb, and/or combinations thereof; group IV-VI compound semiconductor nanocrystals such as PbS, PbSe, PbTe, and/or combinations thereof; group I-III-VI compound semiconductor nanocrystals such as $AgGaS_2$, $AgGaSe_2$, $AgGaTe_2$, $CuInS_2$, $CuInSe_2$, $CuGaS_2$, $CuGaSe_2$ and/or combinations thereof; metal oxide nanoparticles such as ZnO, $TiO_2$, and/or a combination thereof; and/or core-shell structured nanocrystals such as CdSe/ZnSe, CdSe/ZnS, CdS/ZnSe, CdS/ZnS, ZnSe/ZnS, InP/ZnS, ZnO/MgO, and/or any combination thereof. Semiconductor nanoparticles may be undoped or doped with a rare earth element such as Eu, Er, Tb, Tm, Dy, or any combination thereof, or may be doped with a transition metal element such as Mn, Cu, Ag, or any combination thereof.

When the EML 250 is made of inorganic luminescent particles such as quantum dots or quantum rods, the EML 250 is formed by applying a solution containing quantum dots or quantum rods in a solvent on the first charge transfer layer 240, for example, the ETL 244 through a process using the solution, and then, volatilizing the solvent.

When the EML 250 is made of an organic light-emitting material, the EML 250 may be made of an organic light-emitting material emitting red light, green light, and/or blue light and may include a fluorescent material or a phosphorescent material. In addition, the organic light-emitting material constituting the EML 250 may include a host and a dopant. When the organic light-emitting material is configured as a host-dopant system, a dopant may be doped at a ratio of about 1-50 wt %, preferably, about 1-30 wt % with respect to the weight of a host, but the present disclosure is not limited thereto.

When the EML 250 is made of the organic light-emitting material, the EML 250 may be formed using a vacuum deposition process including a vacuum vapor deposition process and a sputtering process, and a solution process such as one from among a spin coating method, a drop coating method, a dip coating method, a spray coating method, a roll coating method, a flow coating method, a casting process, a screen printing method, and inkjet printing method or combinations thereof.

In the second exemplary embodiment of the present disclosure, the second charge transfer layer 260 may be an electron transfer layer configured to supply holes to the EML 250. In an exemplary embodiment, the second charge transfer layer 260 includes an HIL 262 disposed adjacent to the second electrode 220 between the second electrode 220 and the EML 250 and an HTL 264 disposed adjacent to the EML 250 between the second electrode 220 and the EML 250.

The HIL 262 may be made of a material selected from the group consisting of PEDOT:PSS, TDATA doped with F4-TCNQ, e.g., p-doped phthalocyanine such as ZnPc doped with F4-TCNQ, α-NPD doped with F4-TCNQ, HAT-CN, and combinations thereof, but the present disclosure is not limited thereto. In an example, a dopant such as F4-TCNQ may be doped at a ratio of about 1 wt % to about 30 wt % with respect to the weight of a host. The HIL 262 may be omitted according to the structure and shape of the LED 200.

The HTL 264 includes the organic compound represented by Formula 1 or any one of Formula 3, which includes an imidazolium-based cation moiety and an amine-based anion moiety (for example, represented by Formula 2). The organic compound represented by Formula 1 or any one of Formula 3 may be used as a dopant of the HTL 264. In this case, the HTL 264 may include, as a host, an organic material including a triphenylamine moiety, for example, the organic materials represented by Formulae 4 to 6.

The second charge transfer layer 260 may include a single layer. For example, the HIL 262 may be omitted, and the second charge transfer layer 260 may include only the HTL 264. Each of the HIL 262 and the HTL 264 may have a thickness of about 10 nm to about 200 nm, preferably, a thickness of about 10 nm to about 100 nm, but the present disclosure is not limited thereto.

Similar to the first exemplary embodiment, the light-emitting diode 200 according to the second exemplary embodiment of the present disclosure may include at least one exciton blocking layer disposed adjacent to the EML 250. For example, the LED 200 may further include an electron blocking layer disposed between the EML 250 and the HTL 264 and configured to control and prevent movement of electrons; and/or a hole blocking layer disposed between the ETL 244 and the EML 250 and configured to control and prevent movement of holes.

In the LED 200 according to the second exemplary embodiment of the present disclosure, the HTL 264 constituting the second charge transfer layer 260 disposed between the second electrode 220 and the EML 250 includes an organic compound which includes an imidazolium-based cationic moiety and an amine-based anionic moiety. Therefore, as schematically shown in FIG. 5, a difference $\Delta G'_H$ between a HOMO energy level of the HTL 264 and a HOMO energy level of the EML 250 is greatly decreased, thereby removing an energy barrier between the HTL 264 and the EML 250.

For example, the organic compound represented by Formula 1 or any one of Formula 3 may be used in the HTL 264, and thus, the difference $\Delta G'_H$ between the HOMO energy level of the HTL 264 and the HOMO energy level of the EML 250 is the same as or similar to a difference $\Delta G_L$ between a LUMO energy level of the ETL 244 and a LUMO energy level of the EML 250. Since holes and electrons are injected into the EML 250 in a balanced manner to form excitons, electrons, which disappear without forming excitons, decrease or are eliminated. In addition, luminescence efficiently occurs in a light-emitting material injected into the EML 250 rather than at interfaces of the adjacent charge transfer layers (HTL and ETL) and the EML 250. Therefore, luminous efficiency of the LED 200 can be maximized, and LED 200 can be driven at a low voltage to reduce power consumption.

Figure 6:
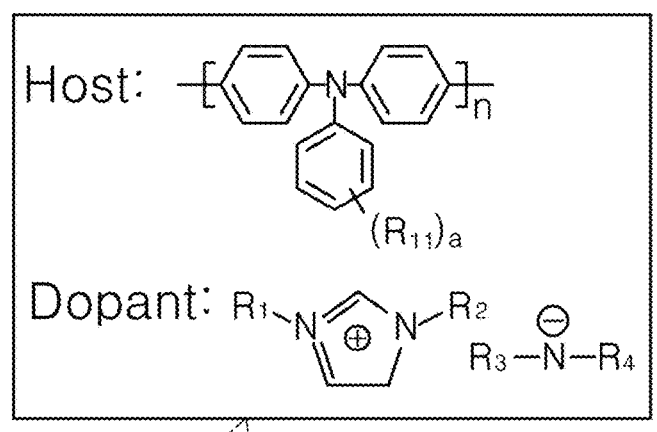
FIG. 6 is a schematic cross-sectional view illustrating an LED display device as an example of a light-emitting device to which an LED according to an exemplary embodiment of the present disclosure is applied.
Figure 6:
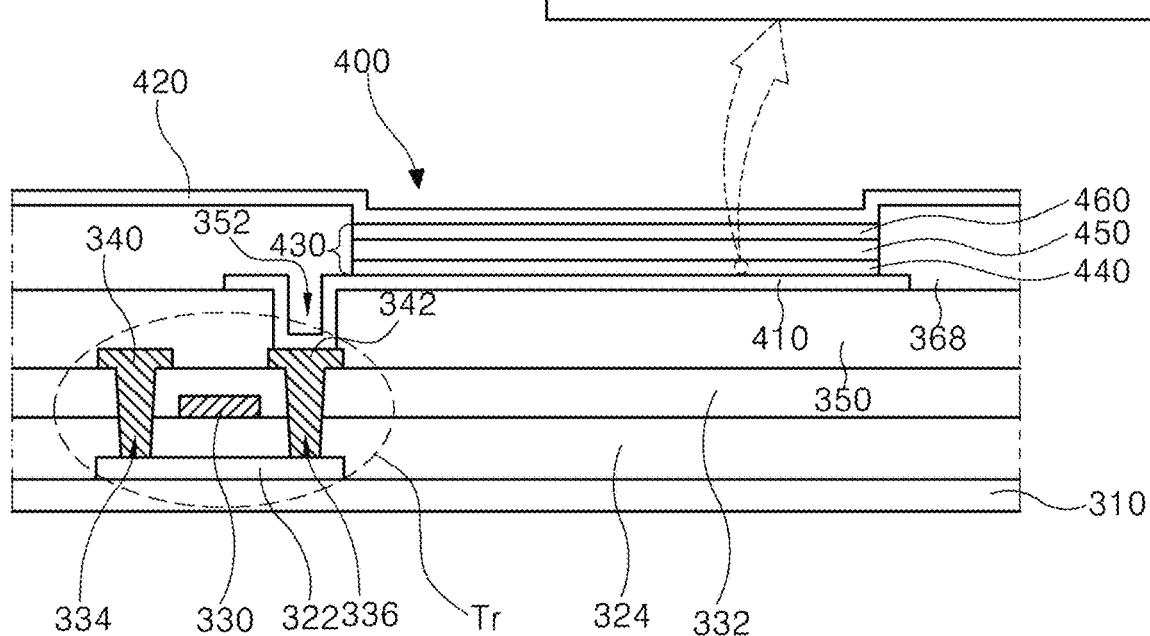

An LED, in which an organic compound including an imidazolium-based cationic moiety and an amine-based anionic moiety is applied to an HTL according to the present disclosure, may be applied to a light-emitting device such as a lighting device or a display device. In an example, a light-emitting device including an LED, in which an organic compound according to the present disclosure is applied to an HTL, will be described. FIG. 6 is a schematic cross-sectional view illustrating a light-emitting display device 300 according to an exemplary embodiment of the present disclosure.

As shown in FIG. 6, the light-emitting display device 300 includes a substrate 310, a driving thin film transistor Tr, for example, a driving element disposed on the substrate 310, and an LED 400 connected to the driving thin film transistor Tr.

A semiconductor layer 322 made of an oxide semiconductor material or polycrystalline silicon is formed on the substrate 310. When the semiconductor layer 322 is made of an oxide semiconductor material, a light shielding pattern (not shown) may be formed on a lower portion of the semiconductor layer 322. The light shielding pattern prevents light from being incident on the semiconductor layer 322 and thus prevents the semiconductor layer 322 from being degraded by light. Alternatively, the semiconductor layer 322 may be made of polycrystalline silicon. In this case, impurities may be doped into both edges of the semiconductor layer 322.

A gate insulating film 324 made of an insulating material is formed on an upper portion of the semiconductor layer 322. The gate insulating film 324 may be made of an inorganic insulating material such as silicon oxide ($SiO_2$) or silicon nitride ($SiN_x$). A gate electrode 330 made of a conductive material such as a metal is formed on an upper portion of the gate insulating film 324 so as to correspond to a center of the semiconductor layer 322.

An interlayer insulating film 332 made of an insulating material is formed on an upper portion of the gate electrode 330. The interlayer insulating film 332 may be made of an inorganic insulating material such as silicon oxide ($SiO_2$) or silicon nitride ($SiN_x$), or may be made of an organic insulating material such as benzocyclobutene or photo-acryl.

The interlayer insulating film 332 has first and second semiconductor layer contact holes 334 and 336 configured to expose both sides of the semiconductor layer 322. The first and second semiconductor layer contact holes 334 and 336 are spaced apart from the gate electrode 330 at both sides of the gate electrode 330. A source electrode 340 and a drain electrode 342 made of a conductive material such as a metal are formed on the interlayer insulating film 332.

The source electrode 340 and the drain electrode 342 are spaced apart with respect to the center of the gate electrode 330 and are in contact with both sides of the semiconductor layer 322 through the first and second semiconductor layer contact holes 334 and 336, respectively. The semiconductor layer 322, the gate electrode 330, the source electrode 340, and the drain electrode 342 constitute the driving element, e.g., the driving thin film transistor Tr.

In FIG. 6, the driving thin film transistor Tr has a coplanar structure in which the gate electrode 330, the source electrode 340, and the drain electrode 342 are disposed on the upper portion of the semiconductor layer 322. Alternatively, the driving thin film transistor Tr may have an inverted staggered structure in which a gate electrode is disposed on a lower portion of a semiconductor layer and a source electrode and a drain electrode are disposed on an upper portion of the semiconductor layer. In this case, the semiconductor layer may be made of amorphous silicon.

Although not shown, a gate line and a data line cross each other to define a pixel region, and a switching element connected to the gate line and the data line is further formed. The switching element is connected to the driving element, e.g., the driving thin film transistor Tr. In addition, a power line is formed to be spaced apart from and parallel to the gate line or the data line, and a storage capacitor is further formed to constantly maintain a voltage of the gate electrode of the driving element, e.g., the driving thin film transistor Tr during one frame.

Meanwhile, a passivation layer 350 is formed to cover the driving thin film transistor Tr and has a drain contact hole 352 configured to expose the drain electrode 342 of the driving thin film transistor Tr.

A first electrode 410 connected to the drain electrode 342 of the driving thin film transistor Tr through the drain contact hole 352 is formed on the passivation layer 350 so as to be formed separately for each pixel region. The first electrode 410 may be an anode or a cathode and may be made of a conductive material having a relatively large work function value. For example, the first electrode 410 may be made of a doped or undoped metal oxide such as ITO, IZO, ITZO, ICO, $SnO_2$, $In_2O_3$, Cd:ZnO, F:$SnO_2$, In:$SnO_2$, Ga:$SnO_2$, or AZO, or may be made of a material including nickel (Ni), platinum (Pt), gold (Au), silver (Ag), iridium (Ir), or a carbon nanotube in addition to the above-described metal oxides.

Meanwhile, when the light-emitting display device 300 of the present disclosure is a top-emission type, a reflective electrode or a reflective layer may be further formed on a lower portion of the first electrode 410. For example, the reflective electrode or the reflective layer may be made of an aluminum-palladium-copper (APC) alloy.

In addition, a bank layer 368 covering an edge of the first electrode 410 is formed on the passivation layer 350. The bank layer 368 exposes a center of the first electrode 410 which corresponds to a pixel region.

An emissive layer 430 is formed on the first electrode 410. The emissive layer 430 may include only an EML but may include a plurality of charge transfer layers so as to improve luminous efficiency. In an example, the emissive layer 430 is illustrated in FIG. 6 as including a first charge transfer layer 440, an EML 450, and a second charge transfer layer 460 which are sequentially stacked between the first electrode 410 and a second electrode 420.

For example, the first charge transfer layer 440 may be a hole transfer layer and may include an HIL 142 (see FIG. 2) and an HTL 144 (see FIG. 2). The first charge transfer layer 440 includes the organic compound represented by Formula 1 or any one of Formula 3, which includes the imidazolium-based cationic moiety and the amine-based anionic moiety. The organic compound may be used as a dopant of an HTL. In this case, the organic materials represented by Formulae 4 to 6 and including a triphenylamine moiety may be used as a host of the HTL.

The EML 450 may be made of inorganic luminescent particles or an organic light-emitting material. Meanwhile, the second charge transfer layer 460 may be an electron transfer layer and may include an EIL 162 (see FIG. 2) and an ETL 164 (see FIG. 2). For example, the second charge transfer layer 460 may be made of an inorganic material or an organic material.

The second electrode 420 is formed on the upper portion of the substrate 310, on which the emissive layer 430 is formed. The second electrode 420 may be formed on an entire surface of a display region, may be made of a conductive material having a relatively small work function value, and may be a cathode or an anode. For example, the second electrode 420 may be made of at least one selected from Ca, Ba, Ca/Al, LiF/Ca, LiF/Al, $BaF_2$/Al, CsF/Al, $CaCO_3$/Al, $BaF_2$/Ca/Al, Al, Mg, Au:Mg, and Ag:Mg.

FIG. 6 exemplarily shows the LED 400 having a normal structure in which the first charge transfer layer 440 is disposed as a hole transfer layer between the first electrode 410 and the emissive layer 450 and a second charge transfer layer 460 is disposed as an electron transfer layer between the second electrode 420 and the EML 450.

In another embodiment, an LED may be manufactured to have an inverted structure in which the first charge transfer layer 440 is disposed as an electron transfer layer between the first electrode 410 and the emissive layer 450 and the second charge transfer layer 460 is disposed as a hole transfer layer between the second electrode 420 and the EML 450. In this case, the organic compound represented by Formula 1 or any one of Formula 3 may be used in an HTL constituting the second charge transfer layer 460 disposed between the second electrode 420 and the EML 450.

The organic compound represented by Formula 1 or any one of Formula 3 may be used in the first charge transfer layer 440 or the second charge transfer layer 460, which may be a hole transfer layer, and thus, a difference between a HOMO energy level of the hole transfer layer and a HOMO energy level of the EML 450 may be decreased, thereby removing an energy barrier between the hole transfer layer and the EML 450. Since holes and electrons are injected into the EML 450 in a balanced manner, luminous efficiency of the LED 400 and the light-emitting display device 300 can be improved, and the LED 400 and the light-emitting display device 300 can be driven at a low voltage to reduce power consumption.

Hereinafter, the present disclosure will be described through exemplary embodiments, but is not limited to the technical idea described in the following embodiments.

Synthesis Example 1: Synthesis of Compound HT01

(1) Synthesis of A3

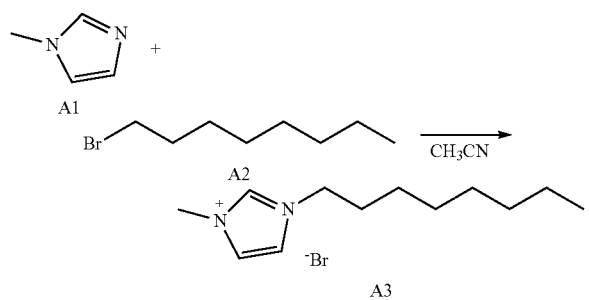

3.0 g (36.5 mmol) of A1 and 7.76 g (39.9 mmol) of A2 were dissolved in 50 mL of acetonitrile in a 250-mL round-bottom flask and then were heated and stirred for 72 hours. After the reaction was completed, the acetonitrile was removed. Then, extraction was performed using dichloromethane and water and then vacuum distillation was performed. After silica gel column chromatography was performed, a solvent was subjected to vacuum distillation to obtain 7.54 g of Compound A3 (yield: 75%).

(2) Synthesis of HT01

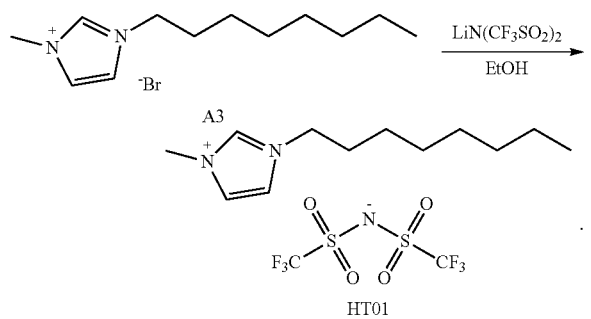

3.0 g (10.8 mmol) of A3 and 4.69 g (16.2 mmol) of LiN(CF$_3$SO$_2$)$_2$ were dissolved in 120 mL of ethanol in a 250-mL round-bottom flask and then were stirred at room temperature for 24 hours. After the reaction was completed, extraction was performed using dichloromethane and water and then vacuum distillation was performed. After silica gel column chromatography was performed, a solvent was subjected to vacuum distillation to obtain 4.92 g of Compound HT01 (yield: 95%).

Synthesis Example 2: Synthesis of Compound HT02

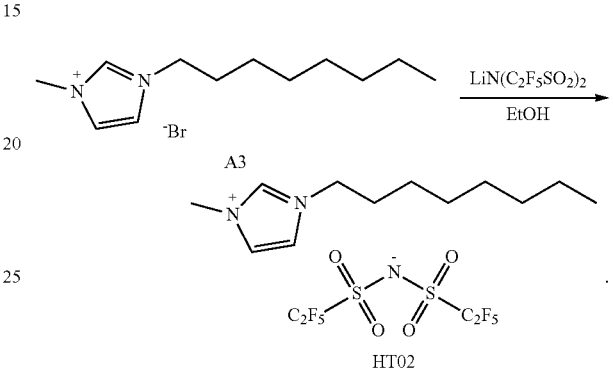

3.0 g (10.8 mmol) of A3 and 6.27 g (16.2 mmol) of LiN(C$_2$F$_5$SO$_2$)$_2$ were dissolved in 120 mL of ethanol in a 250-mL round-bottom flask and then were stirred at room temperature for 24 hours. After the reaction was completed, extraction was performed using dichloromethane and water and then vacuum distillation was performed. After silica gel column chromatography was performed, a solvent was subjected to vacuum distillation to obtain 5.39 g of Compound HT02 (yield: 86%).

Synthesis Example 3: Synthesis of Compound HT03

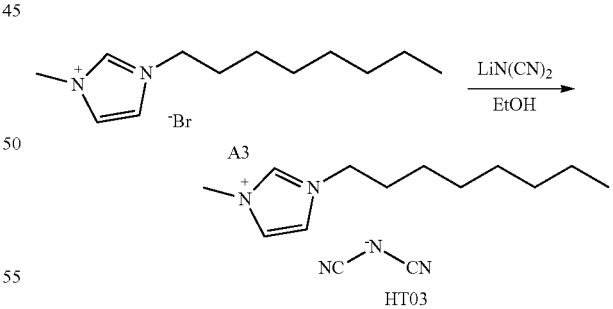

3.0 g (10.8 mmol) of A3 and 1.20 g (16.2 mmol) of LiN(CN)$_2$ were dissolved in 120 mL of ethanol in a 250-mL round-bottom flask and then were stirred at room temperature for 24 hours. After the reaction was completed, extraction was performed using dichloromethane and water and then vacuum distillation was performed. After silica gel column chromatography was performed, a solvent was subjected to vacuum distillation to obtain 2.11 g of Compound HT03 (yield: 74%).

Synthesis Example 4: Synthesis of Compound HT04

(1) Synthesis of Compound A5

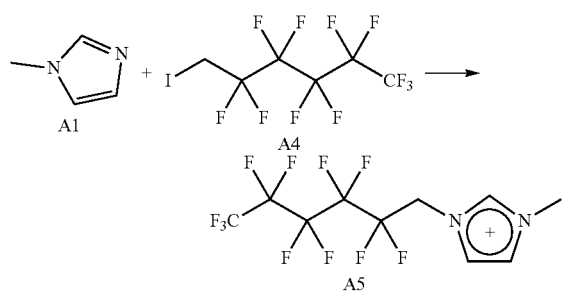

3.0 g (36.5 mmol) of A1 and 22.5 g (39.9 mmol) of A4 were dissolved in 50 mL of acetonitrile in a 250-mL round-bottom flask and then were heated and stirred for 72 hours. After the reaction was completed, the acetonitrile was removed. Then, extraction was performed using dichloromethane and water and then vacuum distillation was performed. After silica gel column chromatography was performed, a solvent was subjected to vacuum distillation to obtain 10.13 g of Compound A5 (yield: 56%).

(2) Synthesis of HT04

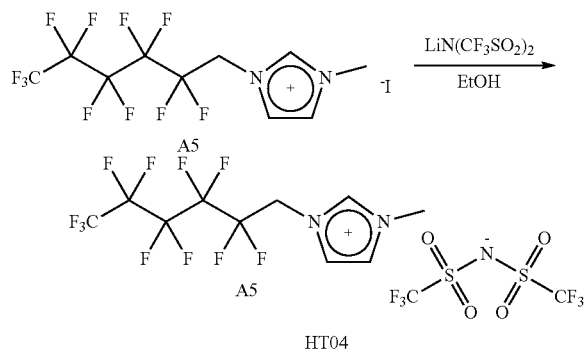

3.0 g (6.06 mmol) of A5 and 2.61 g (9.09 mmol) of $LiN(CF_3SO_2)_2$ were dissolved in 120 mL of ethanol in a 250-mL round-bottom flask and then were stirred at room temperature for 24 hours. After the reaction was completed, extraction was performed using dichloromethane and water and then vacuum distillation was performed. After silica gel column chromatography was performed, a solvent was subjected to vacuum distillation to obtain 3.30 g of Compound HT04 (yield: 84%).

Synthesis Example 5: Synthesis of Compound HT05

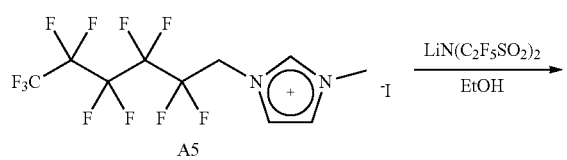

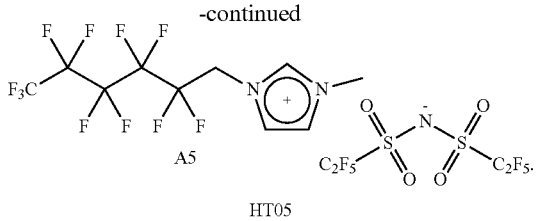

3.0 g (6.06 mmol) of A5 and 3.52 g (9.09 mmol) of $LiN(C_2F_5SO_2)_2$ were dissolved in 120 mL of ethanol in a 250-mL round-bottom flask and then were stirred at room temperature for 24 hours. After the reaction was completed, extraction was performed using dichloromethane and water and vacuum distillation was performed. After silica gel column chromatography was performed, a solvent was subjected to vacuum distillation to obtain 2.09 g of Compound HT05 (yield: 46%).

Example 1: Manufacture of LED

An LED was manufactured using Compound HT01 according to Synthesis Example 1 as a dopant of an HTL. ITO glass (substrate) was patterned and cleaned so as to have an emission area of 3 mm×3 mm. Next, an emissive layer and a cathode were stacked according to the following sequence: PEDOT:PSS was spin-coated at 7,000 rpm and then dried at a temperature of 150° C. for 30 minutes to form an HIL having a thickness of 20 nm to 40 nm; TFB:HT01 having a weight ratio of 2:1 to 1:2 and a concentration of 8 mg/mL in toluene was spin-coated at 4,000 rpm and then was dried at a temperature of 170° C. for 30 minutes to form a HTL having a thickness of 10 nm to 30 nm; InP/ZnSe/ZnS was spin-coated at 2,000 rpm and then dried at a temperature of 80° C. for 1 hour to form an EML having a thickness of 10 nm to 30 nm; 2-[4-(9,10-Di-2-naphthalenyl-2-anthracenyl)phenyl]-1-phenyl-1H-benzimidazole (LIQ (50%)) was used to form an ETL having a thickness of 30 nm to 50 nm; and after the substrate was transferred to a vacuum chamber, Al was deposited at a pressure of $1×10^{-6}$ Torr to stack a cathode having a thickness of 80 nm.

After the deposition, the substrate was transferred from a deposition chamber to a dry box in order to form a film, and subsequently, encapsulation was performed using UV-curable epoxy and a water getter. The LED has an emission area of 9 $mm^2$.

Example 2: Manufacture of LED

An LED was manufactured by repeating the procedure of Example 1 except that Compound HT02 manufactured according to Synthesis Example 2 was used as a dopant of an HTL.

Example 3: Manufacture of LED

An LED was manufactured by repeating the procedure of Example 1 except that Compound HT03 manufactured according to Synthesis Example 3 was used as a dopant of an HTL.

Example 4: Manufacture of LED

An LED was manufactured by repeating the procedure of Example 1 except that Compound HT04 manufactured according to Synthesis Example 4 was used as a dopant of an HTL.

Example 5: Manufacture of LED

An LED was manufactured by repeating the procedure of Example 1 except that Compound HT05 manufactured according to Synthesis Example 5 was used as a dopant of an HTL.

Comparative Example 1: Manufacture of LED

An LED was manufactured by repeating the procedure of Example 1 except that only TFB was applied without applying a dopant to an HTL.

Comparative Example 2: Manufacture of LED

An LED was manufactured by repeating the procedure of Example 1 except that only p-TFB was applied without applying a dopant to an HTL.

Experimental Example: Evaluation of Physical Properties of LED

Figure 7:
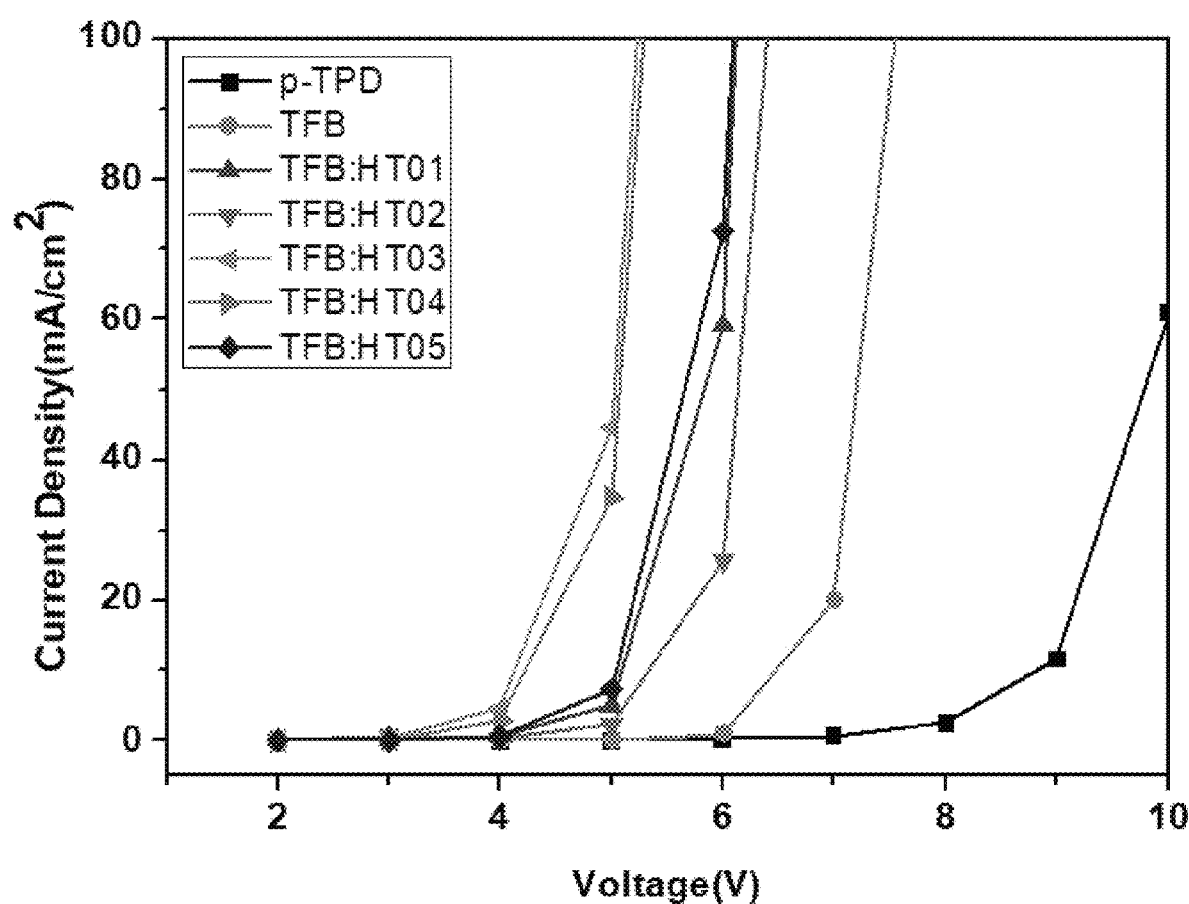
FIG. 7 is a graph showing measurement results of voltage-current density of the LEDs manufactured according to the exemplary embodiments of the present disclosure.
Figure 8:
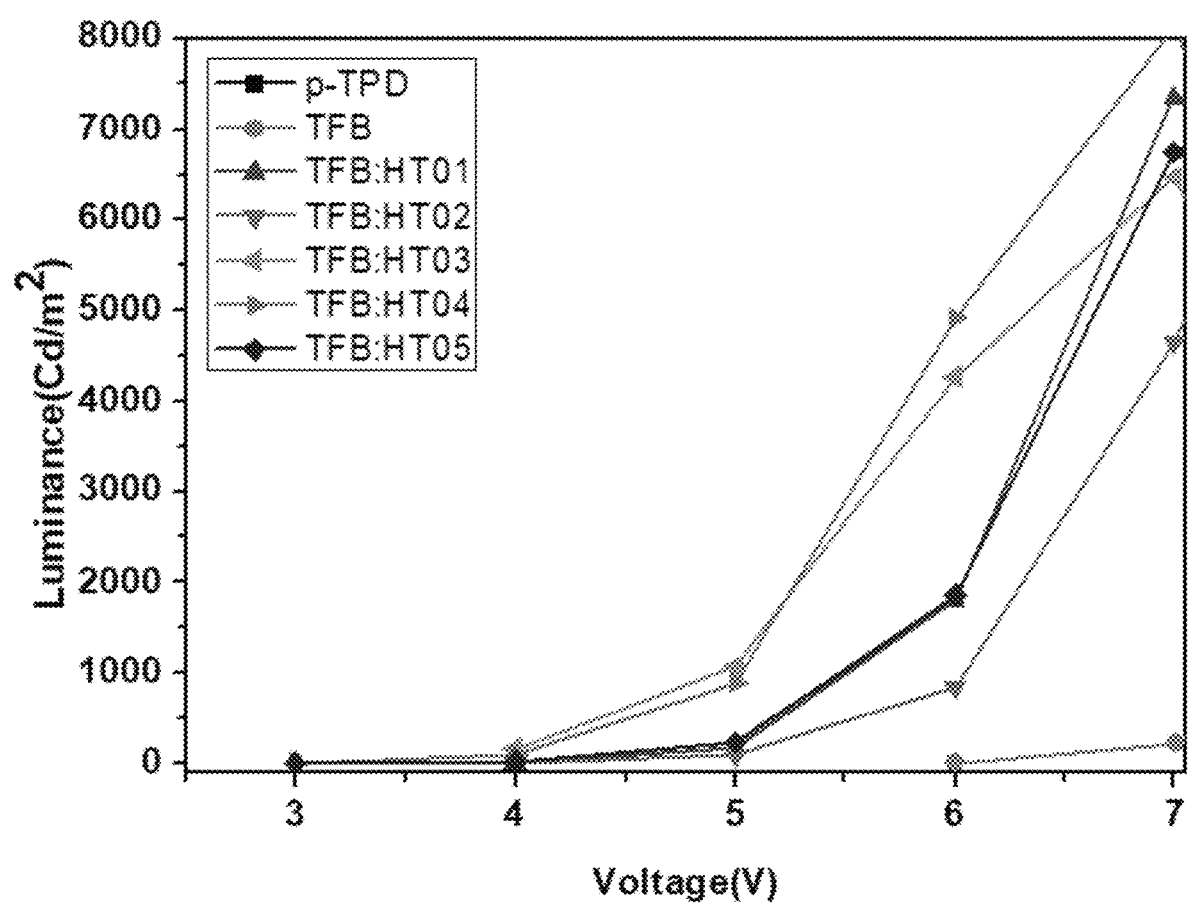
FIG. 8 is a graph showing measurement results of voltage-luminance of the LEDs manufactured according to the exemplary embodiments of the present disclosure.
Figure 9:
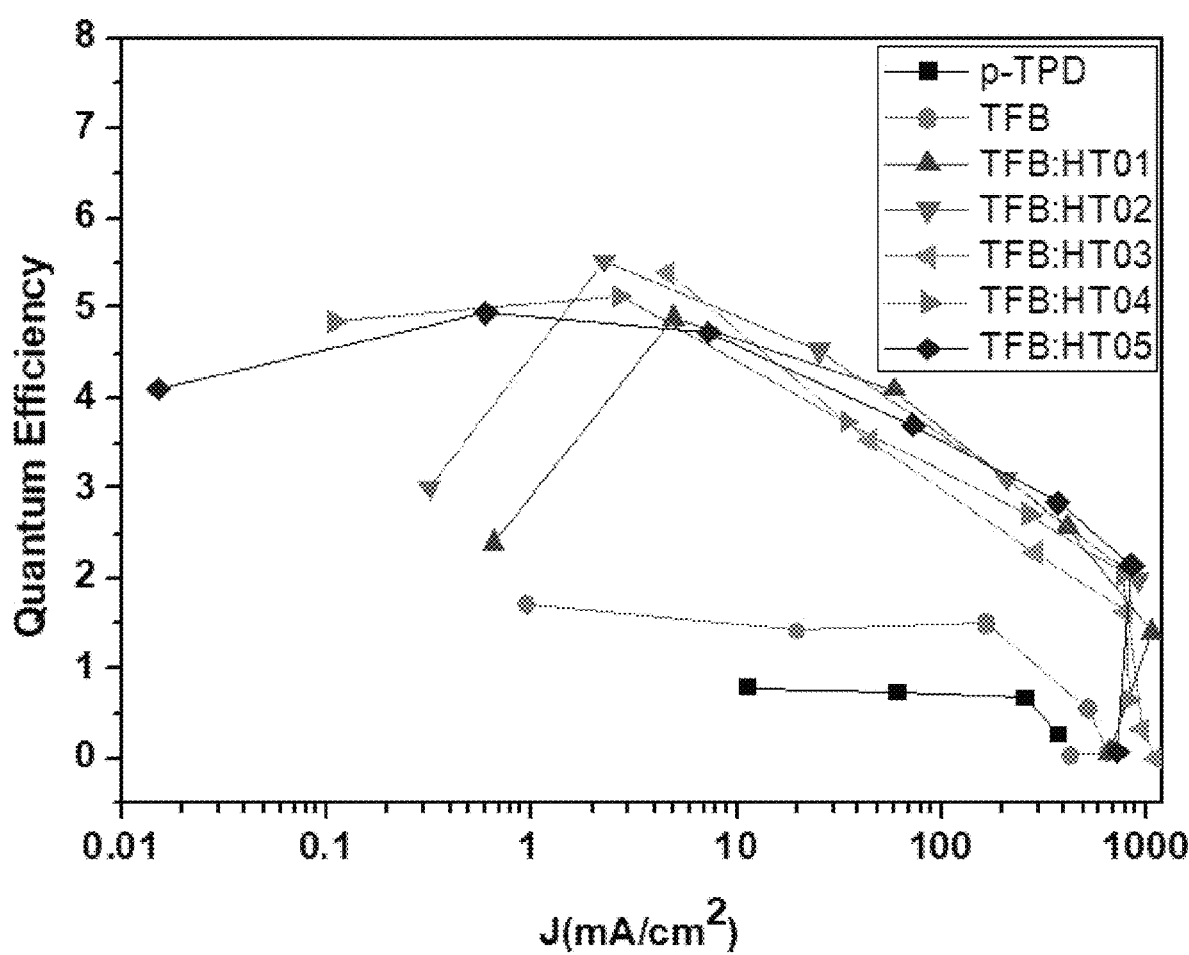
FIG. 9 is a graph showing measurement results of current density-external quantum efficiency of the LEDs manufactured according to the exemplary embodiments of the present disclosure.

The LEDs manufactured in Examples 1 to 5 and Comparative Examples 1 and 2 were connected to an external power supply, and EL properties of all devices manufactured in the present disclosure were evaluated at room temperature by using a constant current source (KEITHLEY) and a photometer PR 650. Specifically, a driving voltage (V), current efficiency (Cd/A), external quantum efficiency (EQE), and color coordinates with respect to an emission wavelength of the LED manufactured in each of Examples 1 to 5 and Comparative Examples 1 and 2 were measured. Measurement results were shown in Table 1. FIGS. 7 to 9 respectively show measurement results of voltage-current density, voltage-luminance, current density-external quantum efficiency of the LEDs manufactured in Examples 1 to 5 and Comparative Examples 1 and 2.

TABLE 1

| | Emission properties of LED | | | | |
| --- | --- | --- | --- | --- | --- |
| | | 10 mA/cm$^2$ | | | |
| Sample | Voltage (V) | Cd/A | EQE (%) | CIEx | CIEy |
| Example 1 | 5.21 | 4.03 | 5.47 | 0.681 | 0.318 |
| Example 2 | 5.17 | 3.78 | 5.30 | 0.682 | 0.317 |
| Example 3 | 4.37 | 3.54 | 5.17 | 0.6878 | 0.316 |
| Example 4 | 4.54 | 3.54 | 5.13 | 0.681 | 0.318 |
| Example 5 | 5.09 | 3.79 | 5.43 | 0.681 | 0.317 |
| Comparative Example 1 | 6.8 | 0.79 | 2.19 | 0.663 | 0.321 |
| Comparative Example 2 | 9.2 | 0.75 | 1.13 | 0.675 | 0.320 |

As shown in Table 1, when the LEDs using an HTL made of TFB doped with an organic compound including a cationic moiety and an anionic moiety according to the present disclosure are compared with the LEDs using an HTL made of only TFB, a voltage is reduced by up to 35.7%, current efficiency is increased by up to 410%, and external quantum efficiency is increased by up to 150%. Therefore, when the organic compound including the cationic moiety and the anionic moiety according to the present disclosure is used in the HTL according to the present disclosure, it can be confirmed that it is possible to realize an LED and a light-emitting device, driven at low voltage and having considerably improved luminous efficiency and quantum efficiency.

The present disclosure proposes an LED in which an organic compound including an imidazolium-based cationic moiety and an amine-based anionic moiety is applied to a hole transfer layer. According to the present disclosure, an organic compound including a cationic moiety and an anionic moiety is applied, and thus, a difference between a HOMO energy band of a hole transfer layer and a HOMO energy band of an EML is greatly decreased.

In a light-emitting device of the present disclosure, holes and electrons are injected into an EML in a balanced manner to efficiently form excitons, thereby contributing to light emission. Therefore, it is possible to realize and manufacture an LED and a light-emitting device, having improved luminous efficiency and driven at low voltage to reduce power consumption.

It will be apparent to those skilled in the art that various modifications and variations can be made in the light-emitting diode and light-emitting device using the same of the present disclosure without departing from the technical idea or scope of the disclosure. Thus, it is intended that the present disclosure cover the modifications and variations of this disclosure provided they come within the scope of the appended claims and their equivalents.

What is claimed is:
1. A light-emitting diode, comprising:
   first and second electrodes facing each other; and
   an emissive layer between the first electrode and the second electrode and comprising a hole transfer layer made of an organic material and an emitting material layer between the second electrode and the hole transfer layer or between the first electrode and the hole transfer layer,
   wherein the hole transfer layer includes an organic compound selected from:

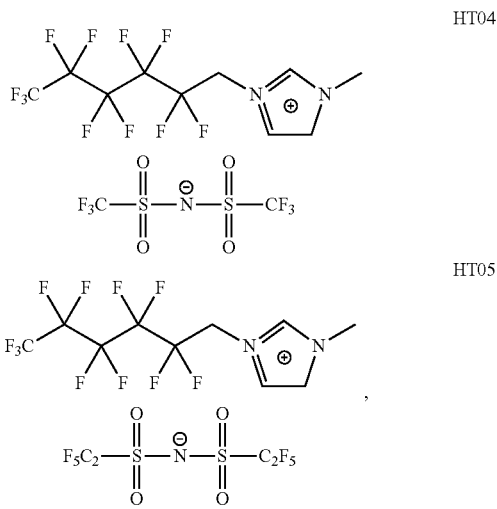

and
   wherein the emitting material layer comprises inorganic luminescent particles.

2. The light-emitting diode of claim 1, wherein the hole transfer layer comprises a hole transport layer between the first electrode and the second electrode, and a hole injection layer between the hole transport layer and the second electrode or between the hole transport layer and the first electrode, and the hole transport layer comprises the organic compound as a dopant and any one host represented by Formulae 4 to 6 below:

Formula 4
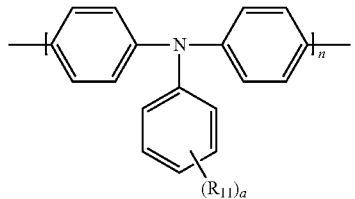

Formula 5
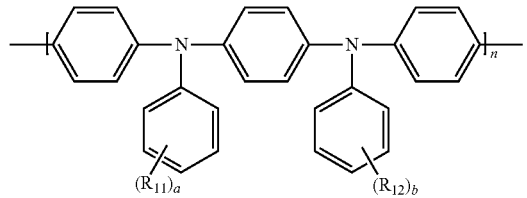

Formula 6
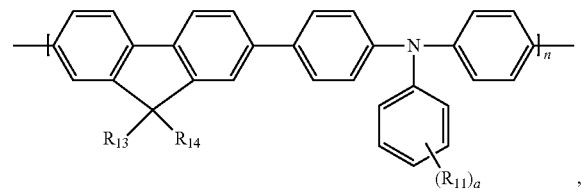

wherein each of $R_{11}$ to $R_{14}$ is independently an unsubstituted or substituted $C_1$-$C_{20}$ linear or branched alkyl group, an unsubstituted or substituted $C_1$-$C_{20}$ alkoxy group, an unsubstituted or substituted $C_6$-$C_{30}$ homoaryl group, or an unsubstituted or substituted $C_4$-$C_{30}$ heteroaryl group; each of a and b is an integer from 1 to 4; and n is an integer of 1 or more.

3. The light-emitting diode of claim 1, wherein the hole transfer layer comprises the organic compound as a dopant.

4. The light-emitting diode of claim 1, wherein the hole transfer layer comprises a hole transport layer between the first electrode and the second electrode, and a hole injection layer between the hole transport layer and the second electrode or between the hole transport layer and the first electrode, and wherein the hole transport layer comprises the organic compound.

5. The light-emitting diode of claim 1, wherein the inorganic luminescent particles comprise quantum dots (QDs) or quantum rods (QRs).

6. The light-emitting diode of claim 1, wherein the emissive layer further includes an electron transfer layer between the first electrode and the emitting material layer or between the second electrode and the emitting material layer.

7. A light-emitting device, comprising
a substrate;
the light-emitting diode of claim 1, which is disposed on the substrate; and
a thin film transistor between the substrate and the light-emitting diode and connected to the light-emitting diode.

8. The light-emitting device of claim 7, wherein the hole transfer layer comprises the organic compound as a dopant.

9. The light-emitting device of claim 7, wherein the hole transfer layer comprises a hole transport layer between the first electrode and the second electrode, and a hole injection layer between the hole transport layer and the second electrode or between the hole transport layer and the first electrode, and the hole transport layer comprises the organic compound.

10. The light-emitting device of claim 9, wherein the hole transport layer further includes any one host represented by Formula 4 to 6 below:

Formula 4
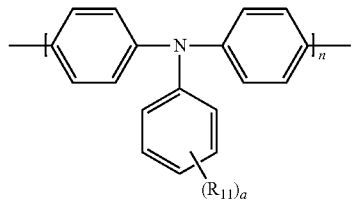

Formula 5
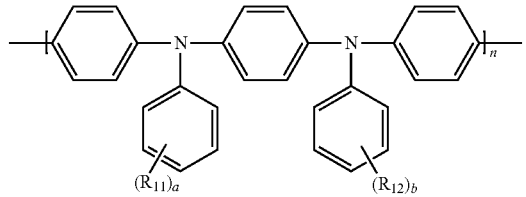

Formula 6
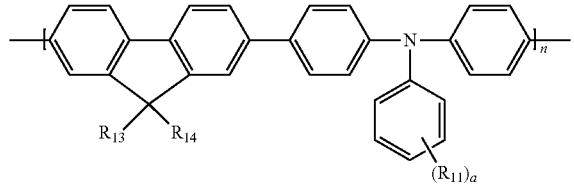

wherein each of $R_{11}$ to $R_{14}$ is independently an unsubstituted or substituted $C_1$-$C_{20}$ linear or branched alkyl group, an unsubstituted or substituted $C_1$-$C_{20}$ alkoxy group, an unsubstituted or substituted $C_6$-$C_{30}$ homoaryl group, or an unsubstituted or substituted $C_4$-$C_{30}$ heteroaryl group; each of a and b is an integer from 1 to 4; and n is an integer of 1 or more.

11. The light-emitting device of claim 7, wherein the inorganic luminescent particles comprise quantum dots (QDs) or quantum rods (QRs).

12. The light-emitting device of claim 7, wherein the emissive layer further includes an electron transfer layer between the first electrode and the emitting material layer or between the second electrode and the emitting material layer.

* * * * *